(12) United States Patent
Ueda

(10) Patent No.: US 7,755,195 B2
(45) Date of Patent: Jul. 13, 2010

(54) SEMICONDUCTOR APPARATUS INTEGRATING AN ELECTRICAL DEVICE UNDER AN ELECTRODE PAD

(75) Inventor: Naohiro Ueda, Kobe (JP)

(73) Assignee: Ricoh Company, Ltd., Tokyo (JP)

( * ) Notice: Subject to any disclaimer, the term of this patent is extended or adjusted under 35 U.S.C. 154(b) by 960 days.

(21) Appl. No.: 11/517,781

(22) Filed: Sep. 8, 2006

(65) Prior Publication Data

US 2007/0063292 A1 Mar. 22, 2007

(30) Foreign Application Priority Data

Sep. 16, 2005 (JP) ............................. 2005-271185

(51) Int. Cl.
*H01L 23/52* (2006.01)
(52) U.S. Cl. ....................... 257/758; 257/779; 257/784; 257/E23.019; 257/E23.142
(58) Field of Classification Search ................ 257/734, 257/758, 779, 780, 784, 786, E23.019, E23.02, 257/E23.142
See application file for complete search history.

(56) References Cited

U.S. PATENT DOCUMENTS 6,858,885 B2 2/2005 Ebara

| 7,038,280 | B2* | 5/2006 | Righter | 257/355 |
| 7,312,530 | B2* | 12/2007 | Hashimoto et al. | 257/758 |
| 2003/0006795 | A1* | 1/2003 | Asayama et al. | 324/763 |
| 2004/0121571 | A1* | 6/2004 | Uchikoshi et al. | 438/586 |

FOREIGN PATENT DOCUMENTS

JP 5-53304 3/1993
JP 2002-319587 10/2002

* cited by examiner

*Primary Examiner*—Matthew E Warren
(74) *Attorney, Agent, or Firm*—Cooper & Dunham LLP

(57) ABSTRACT

A semiconductor apparatus includes a device, two metal-wiring layers, and an insulation film. The device includes first and second electrodes. The two metal-wiring layers include uppermost and next-uppermost metal-wiring layers. The insulation film is formed on the uppermost metal-wiring layer and includes first and second pad openings. The uppermost metal-wiring layer has a first portion exposed to air through the first pad opening and forming a first electrode pad, and the uppermost metal-wiring layer has a second portion exposed to air through the second pad opening and forming a second electrode pad. The first and second electrode pads are located over the device and are electrically connected to the first and second electrodes, respectively. The next-uppermost metal-wiring layer has a first portion located under the first electrode pad and electrically connected thereto, and a second portion located under the second electrode pad and electrically connected thereto.

17 Claims, 24 Drawing Sheets

SEMICONDUCTOR APPARATUS INTEGRATING AN ELECTRICAL DEVICE UNDER AN ELECTRODE PAD

FIELD OF THE DISCLOSURE

The present disclosure relates to a semiconductor apparatus, and more particularly to a semiconductor apparatus having an electrical device under an electrode pad.

DISCUSSION OF THE BACKGROUND

A related-art semiconductor apparatus having an electrode pad is generally provided with no device directly under the electrode pad. In this discussion, an electrode pad is defined as an air-exposed region of a metal-wiring layer through a pad opening formed in an insulation film provided on the metal-wiring layer. The electrode pad generally aims to contact a bonding wire or a soldered bump to electrically connect a semiconductor apparatus to an external device, or a test probe to perform a test of the semiconductor apparatus.

One exemplary related-art semiconductor apparatus is illustrated in FIGS. 1A and 1B. FIG. 1A is a top view of the semiconductor apparatus and FIG. 1B is a cross-sectional side view taken in an A-A line of FIG. 1A.

As illustrated in FIGS. 1A and 1B, an interlayer insulation film 13 is formed on a semiconductor substrate 1, and a metal-wiring layer 17 of a metal material is created on the interlayer insulation film 13. Further, surfaces of the interlayer insulation film 13 and the metal-wiring layer 17 are covered by a final protection film 19. The final protection film 19 is provided with a pad opening 21 above a formation area of an electrode pad 23 in the metal-wiring layer 17. A tip of a bonding wire or a soldered bump is connected to the electrode pad 23 through the pad opening 21.

A semiconductor apparatus having more than one metal-wiring layer can also be provided with an electrode pad. For example, FIGS. 2A-2C illustrate cross sections of different related-art semiconductor apparatuses each having a four-metal-wiring-layer structure.

In FIG. 2A, reference numerals 17-1, 17-2, 17-3, and 17-4 denote first, second, third, and fourth metal-wiring layers, respectively. The fourth metal-wiring layer 17-4 forms an electrode pad 23. Also, reference numerals 13-1, 13-2, 13-3, and 13-4 denote a BPSG (boro-phospho silicate glass) film, a first interlayer insulation film, a second interlayer insulation film, and a third interlayer insulation film, respectively. A final protection film 19 is formed on the third interlayer insulation film 13-4. The final protection film 19 includes a pad opening 21 arranged over the electrode pad 23. The interlayer insulation films 13-2, 13-3, and 13-4 are provided with through holes 15-2, 15-3, and 15-4, respectively, to connect the metal-wiring layers adjacent above and below.

Since the electrode pad 23 is commonly formed by using the fourth metal-wiring layer 17-4, i.e., an uppermost metal-wiring layer, a structure of FIG. 2B having none of the first, second, and third metal-wiring layers 17-1, 17-2, and 17-3 may not have any problem in operations. Also, similarly, a structure of FIG. 2C having none of the through holes 15-2, 15-3, and 15-4 may not have any problem in operations.

One example of the related-art semiconductor apparatus has a device, such as a diode for protecting an input signal, arranged under the electrode pad. In this example, a plurality of diodes are disposed apart from each other at four locations corresponding to four corners of the electrode pad in order to avoid a direct transmission of an external impact to the diodes when the electrode pad is contacted by a bonding wire and the like.

FIGS. 3A-3C demonstrate a wafer test. FIG. 3A is a top view of a semiconductor 25. FIG. 3B is a cross-section side view in which a metal test probe 27 approaches a surface of the electrode pad 23. FIG. 3C is a cross-sectional side view in which the metal test probe 27 touches the electrode pad 23 and pushes the electrode pad 23 downwardly. At this time, the metal test probe 27 is pushes the electrode pad 23 by approximately 50 µm to approximately 100 µm. The test is conducted from one electrode pad to another in an efficient manner, i.e., at an extremely high speed, and therefore the contact of the metal test probe 27 to the surface of the electrode pad 23 is likely a high speed collision. An impact of such a collision may be transmitted through the structure and may cause a crack in the interlayer insulation film, for example.

FIG. 4 is a microphotograph showing a cross section of an evaluation sample of the above related-art semiconductor apparatus in a state after the metal test probe contacts the surface of the electrode pad. This evaluation sample has the four-metal-wiring-layer structure, similar to the structure shown in FIG. 2A. In this microphotograph, cracks 29 are seen in the third interlayer insulation film 13-4 under the electrode pad 23. The cracks 29 are made by the impact given by the metal test probe during the wafer test.

Some related-art semiconductor apparatuses integrate a driver transistor which is defined as a transistor having a relatively large channel width so as to drive a following device.

Operation of the driver transistor is explained with reference to a charging circuit used for a mobile cellular phone, for example, of FIGS. 5A and 5B. A charge battery 31 is connected to a power source 35 (e.g., a household AC wall outlet) via a charge switch 33. FIG. 5A shows the circuit in a state before the charging is conducted, that is, a transistor 37 is in an off state. To conduct charging, the transistor 37 needs to be turned on, so that the charge switch 33 connected to the transistor 37 via an electrode pad 23 is turned on. As a consequence, a current A (see FIG. 5B) flows from the power source 35 to the charge battery 31, and a charging to the charge battery 31 is performed.

In this circuit, the transistor 37 constitutes a driver transistor. In other words, the transistor 37 drives the following device, that is, the charge switch 33. Since the charging time can be reduced with an increase of the current A flowing through the transistor 37, a current B (see FIG. 5B) flowing through the transistor 37 which drives the transistor 37 also needs to be greater. Accordingly, the driver transistor needs to have a channel of a relatively greater width.

Referring to FIGS. 6A-6C, an exemplary layout of the driver transistor is explained. FIG. 6A is a top view of a typical driver transistor. FIG. 6B is a schematic top view. FIG. 6C is a cross-sectional side view taken in an A-A line of FIG. 6B.

As illustrated in FIG. 6C, a LOCOS (local oxidation of silicon) oxide film 3 is formed on a silicon substrate 1 to delimit a formation region 5 for forming a driver transistor therein. A source 7s and a drain 7d of an N-type impurity diffusion layer are formed in the formation region 5 of the silicon substrate 1. The source 7s and the drain 7d are arranged in parallel and alternately with a distance.

A gate electrode 11 of polysilicon is formed between the source 7s and the drain 7d on the silicon substrate 1 via a gate oxide film 9. FIGS. 6B and 6C show only four lines of the gate electrode 11; however, over several tens of the gate electrode is generally formed.

Although it is not shown, an interlayer insulation film 13 is formed on an entire surface of the silicon substrate 1, including formation areas of the source 7s, the drain 7d, and the gate electrode 11. A contact hole 15s is formed in the interlayer insulation film 13 provided on the source 7s, and a contact hole 15d is formed in the interlayer insulation film 13 provided on the drain 7d. Another contact hole is formed in the interlayer insulation film 13 provided on the gate electrode 11 in a region which is not shown.

A metal-wiring layer 17s is formed in a comb-like shape on the surface of the interlayer insulation film 13, including the formation region 5 of the contact hole 15s provided on the source 7s. A plurality of sources 7s are electrically connected to each other via the contact holes 15s and the metal-wiring layer 17s. The metal-wiring layer 17s is electrically connected to the electrode pad 23s formed on an electrode pad formation region of the interlayer insulation film 13 arranged in a vicinity to a driver transistor formation region.

Similarly, a metal-wiring layer 17d is formed in a comb-like shape on the surface of the interlayer insulation film 13, including the formation region 5 of the contact hole 15d provided on the drain 7d. A plurality of drains 7d are electrically connected to each other via the contact holes 15d and the metal-wiring layer 17d. The metal-wiring layer 17d is electrically connected to the electrode pad 23d formed on an electrode pad formation region of the interlayer insulation film 13 arranged in a vicinity to a driver transistor formation region.

In a region not shown, a metal-wiring layer is formed on a region including a formation region of the contact hole provided on the gate electrode 11. A plurality of gate electrodes 11 are electrically connected to each other via the contact holes and the metal-wiring layers which are not shown.

A final protection film 19 is formed on the interlayer insulation film 13. The final protection film 19 includes pad openings 21s and 21d on the electrode pad 23s and the electrode pad 23d, respectively.

As illustrated in FIG. 6C, an alternate arrangement of the sources 7s and the drains 7d is one of typical characteristics of the driver transistor. A current flows in directions, as indicated in FIG. 6C. That is, each of the source 7s and the drain 7d acts on the gate electrodes 11 adjacent thereto on both sides. Accordingly, this structure has an advantage to allow a relatively great current flow with a relatively small area.

FIGS. 7A-7C, 8A, 8B, and 9A and 9B illustrate another related-art semiconductor apparatus having a four-metal-wiring-layer structure. FIG. 7A is a top view of the related-art semiconductor apparatus. FIG. 7B is a cross-sectional side view taken in an A-A line of FIG. 7A, and FIG. 7C is a cross-sectional side view in a B-B line of FIG. 7A. FIG. 8A is a top view of a first metal-wiring layer, and FIG. 8B is a top view of a second metal-wiring layer. FIG. 9A is a top view of a third metal-wiring layer, and FIG. 9B is a top view of a fourth metal-wiring layer.

A LOCOS (local oxidation of silicon) oxide film 3 is formed on the silicon substrate 1. The sources 7s and the drains 7d are arranged alternately with a distance in the formation region of the driver transistor on the silicon substrate 1.

The gate electrode 11 of polysilicon is formed between the source 7s and the drain 7s on the silicon substrate 1 via the gate oxide film 9.

The BPSG film 13-1 is formed on the entire surface of the silicon substrate 1, including the formation regions of the source 7s, the drain 7d, and the gate electrode 11. A contact hole 15s-1 is formed in the BPSG film 13-1 on the source 7s, and a contact hole 15d-1 is formed in the BPSG film 13-1 on the drain 7d. Also, in a region not shown, a contact hole is formed in the interlayer insulation film 13 on the gate electrode 11.

A first metal-wiring layer 17s-1 is formed on a surface of the BPSG film 13-1, including a formation region of the contact hole 15s-1 provided on the source 7s. A first metal-wiring layer 17d-1 is formed on a surface of the BPSG film 13-1, including a formation region of the contact hole 15d-1 provided on the source 7d. Also, in a region not shown, a metal-wiring layer is formed on a surface of the BPSG film 13-1, including a formation region of the contact hole provided on the gate electrode 11.

A first interlayer insulation film 13-2 is formed on a surface of the BPSG film 13-1, including formation regions of the first and second metal-wiring layers 17s-1 and 17d-1. A through hole 15s-2 is formed in the first interlayer insulation film 13-2 created on the first metal-wiring layer 17s-1. A through hole 15d-2 is formed in the first interlayer insulation film 13-2 created on the first metal-wiring layer 17d-1.

A second metal-wiring layer 17s-2 is formed on a surface of the first interlayer insulation film 13-2, including a formation region of the through hole 15s-2 provided on the first metal-wiring layer 17s-1. Also, a second metal-wiring layer 17d-2 is formed on a surface of the first interlayer insulation film 13-2, including a formation region of the through hole 15d-2 provided on the first metal-wiring layer 17d-1.

A second interlayer insulation film 13-3 is formed on a surface of the first interlayer insulation film 13-2, including formation regions of the second metal-wiring layers 17s-2 and 17d-2. A through hole 15s-3 is formed in the second interlayer insulation film 13-3 provided on the second metal-wiring layer 17s-2, and a through hole 15d-3 is formed in the second interlayer insulation film 13-3 provided on the second metal-wiring layer 17d-2.

A third metal-wiring layer 17s-3 is formed on a surface of the second interlayer insulation film 13-3, including a formation region of the through hole 15s-3 formed on the second metal-wiring layer 17s-2. A third metal-wiring layer 17d-3 is formed on a surface of the second interlayer insulation film 13-3, including a formation region of the through hole 15d-3 formed on the second metal-wiring layer 17d-2.

A third interlayer insulation film 13-4 is formed on a surface of the second interlayer insulation film 13-3, including formation regions of the third metal-wiring layers 17s-3 and 17d-3. A through hole 15s-4 is formed in the third interlayer insulation film 13-4 provided on the third metal-wiring layer 17s-3, and a through hole 15d-4 is formed in the third interlayer insulation film 13-4 provided on the third metal-wiring layer 17d-3.

A fourth metal-wiring layer 17s-4 is formed on a surface of the third interlayer insulation film 13-4, including a formation region of the through hole 15s-4 provided on the third metal-wiring layer 17s-3. The fourth metal-wiring layer 17d-4 covers formation regions of a driver transistor and an electrode pad. The fourth metal-wiring layer 17s-4 covers formation regions of a plurality of the third metal-wiring layers 17s-3, and is electrically connected to the plurality of the third metal-wiring layers 17s-3 via a plurality of the through holes 15s-4.

A fourth metal-wiring layer 17d-4 is formed on a surface of the third interlayer insulation film 13-4, including a formation region of the through hole 15d-4 provided on the third metal-wiring layer 17d-3. The fourth metal-wiring layer 17d-4 covers formation regions of a driver transistor and an electrode pad in a region where the fourth metal-wiring layer 17s-4 is not formed. The fourth metal-wiring layer 17d-4 covers formation regions of a plurality of the third metal-wiring layers 17d-3, and is electrically connected to the plurality of the third metal-wiring layers 17d-3 via a plurality of the through holes 15d-4.

A final protection film 19 is formed on a surface of the third interlayer insulation film 13-4, including formation regions of the fourth metal-wiring layers 17s-4 and 17d-4. A pad opening 21s is formed in the final protection film 19 provided on the fourth metal-wiring layer 17s-4 in a formation region of the electrode pad, and a pad opening 21d is formed in the final protection film 19 provided on the fourth metal-wiring layer 17d-4 in a formation region of the electrode pad. The fourth metal-wiring layers 17s-4 and 17d-4 under formation regions of the pad openings 21s and 21d form electrode pads 23s and 23d, respectively.

The electrode pad 23s is electrically connected to the source 7s via the fourth metal-wiring layer 17s-4, the through hole 15s-4, the third metal-wiring layer 17s-3, the through hole 15s-3, the second metal-wiring layer 17s-2, the through hole 15s-2, the first metal-wiring layer 17s-1, and the contact hole 15s-1.

The electrode pad 23d is electrically connected to the drain 7d via the fourth metal-wiring layer 17d-4, the through hole 15d-4, the third metal-wiring layer 17d-3, the through hole 15d-3, the second metal-wiring layer 17d-2, the through hole 15d-2, the first metal-wiring layer 17d-1, and the contact hole 15d-1.

The electrode pad 23d is electrically connected to the drain 7d vie the fourth metal-wiring layer 17d-4, the through hole 15d-4, the third metal-wiring layer 17d-3, the through hole 15d-3, the second metal-wiring layer 17d-2, the through hole 15d-2, the first metal-wiring layer 17d-1, and the contact hole 15d-1.

In this way as described above, a plurality of metal-wiring layers are formed one on another in a multi-layered form and have connections with a plurality of through holes and a contact hole. A reason for this is that it is advantageous if a resistance element in a current path at the channels of source 7s and drain 7d can be reduced as small as possible since the driver transistor aims to allow a large amount of current flow.

The first metal-wiring layers 17s-1 and 17d-1, the second metal-wiring layers 17a-2 and 17d-2, and the third metal-wiring layers 17s-3 and 17d-3 form a pattern in a linear shape. However, the fourth metal-wiring layers 17s-4 and 17d-4 form a pattern of a large rectangle shape. This is because the fourth metal-wiring layers need to be thick to allow a large amount of current flow since the currents flowing through the first, second, and third metal-wiring layers enter together into the fourth metal-wiring layers.

The fourth metal-wiring layers 17s-4 and 17d-4 are formed across the metal-wiring layers 17s-1, 17s-2, and 17s-3 in the source side and the metal-wiring layers 17d-1, 17d-2, and 17d-3 in the drain side. Therefore, no through hole is formed on the third metal-wiring layer 17d-3 in the drain side under the fourth metal-wiring layer 17s-4 in the source side. Similarly, no through hole is formed on the third metal-wiring layer 17s-3 in the source side under the fourth metal-wiring layer 17d-4 in the drain side.

The above-described related-art semiconductor apparatus having the driver transistor under the electrode pad may cause such a problem as explained below with reference to FIGS. 10A-10C. FIG. 10A is a top view of the related-art semiconductor apparatus. FIG. 10B is a cross-sectional side view taken in an A-A line of FIG. 10A, and FIG. 10C is a cross-sectional side view taken in a B-B line of FIG. 10A.

In this apparatus, the electrode pads 23s and 23d are formed over the driver transistors. As described above, the third interlayer insulation film 13-4 provided under the electrode pads 23s and 23d may have the cracks 29 due to an impact caused by a collision of the electrode pad with a metal test probe during a wafer test. The cracks 29 can make an electrical short circuit between the fourth metal-wiring layers 17s-4 and 17d-4 and the third metal-wiring layers 17s-3 and 17d-3.

Due to the cracks 29, the fourth metal-wiring layer 17d-4 in the drain side and the third metal-wiring layer 17s-3 in the source side are short-circuited, and the fourth metal-wiring layer 17s-4 in the source side and the third metal-wiring layer 17d-3 in the drain side are short-circuited. In this situation, the driver transistors cannot properly operate.

The above-described problem is caused not only in a case where a device arranged under an electrode pad is a driver transistor but also in a case where a device has two electrodes which are drawn to and connected to the two electrode pads in a way such that a metal-wiring layer electrically connected to one of the two electrodes is arranged under an electrode pad electrically connected to the other one of the two electrodes.

SUMMARY OF THE DISCLOSURE

This patent specification describes a semiconductor apparatus having a structure in which a device having two electrodes is arranged under two electrode pads respectively electrically connected to the two electrodes, while avoiding short circuits between the two electrodes. In one example, a semiconductor apparatus includes a device, at least two metal-wiring layers, and an insulation film. The device is provided with at least two electrodes including first and second electrodes. The two metal-wiring layers include an uppermost metal-wiring layer and a next-uppermost metal-wiring layer. The insulation film is formed on the uppermost metal-wiring layer and includes at least two pad openings including first and second pad openings. In this apparatus, a first portion of the uppermost metal-wiring layer exposed to air through the first pad opening forms a first electrode pad and a second portion of the uppermost metal-wiring layer exposed to air through the second pad opening forms a second electrode pad. Further, in this apparatus, the first electrode pad is located over the device and is electrically connected to the first electrode, and the second electrode pad is located over the device and is electrically connected to the second electrode. Further, in this apparatus, a first portion of the next-uppermost metal-wiring layer is located under the first electrode pad and is electrically connected thereto, and a second portion of the next-uppermost metal-wiring layer is located under the second electrode pad and is electrically connected thereto.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1A:
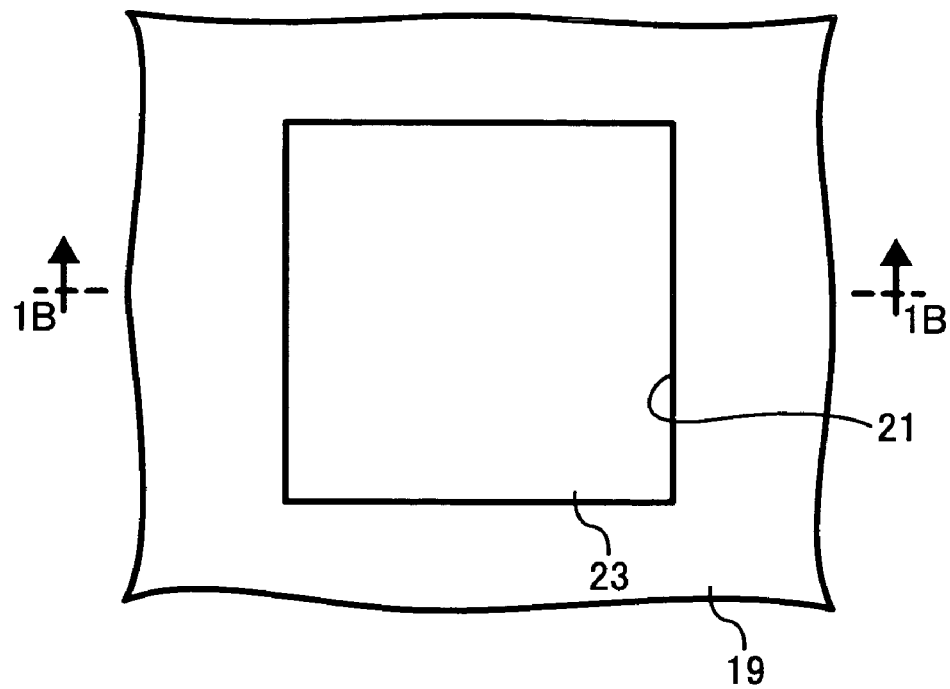
FIGS. 1A and 1B are schematic diagrams of a related-art semiconductor apparatus having an electrode pad.
Figure 1B:
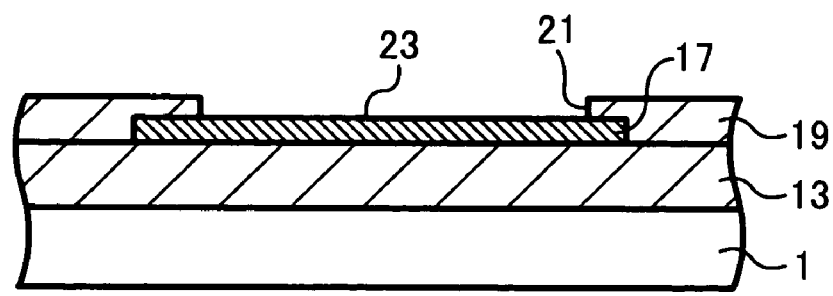
Figure 2A:
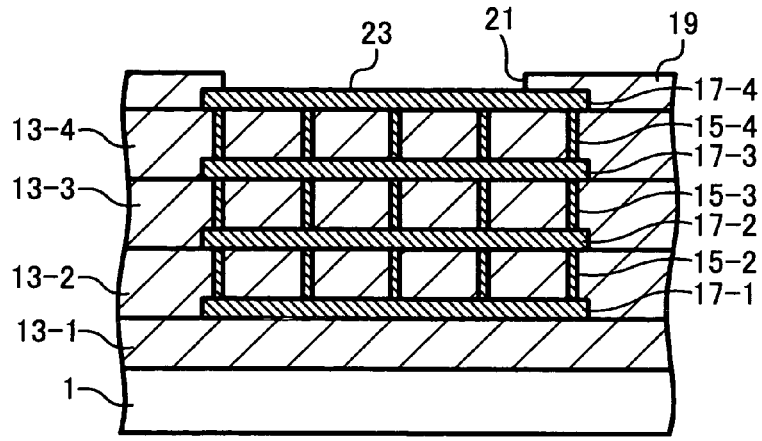
FIGS. 2A-2C are cross-sectional views of different related-art semiconductor apparatuses.
Figure 2B:
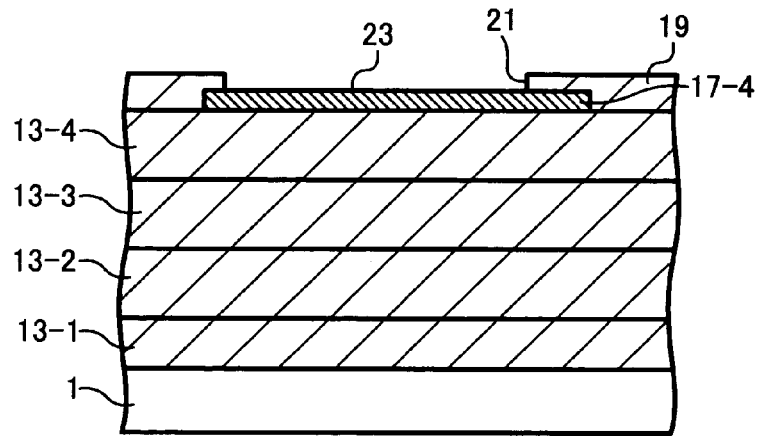
Figure 2C:
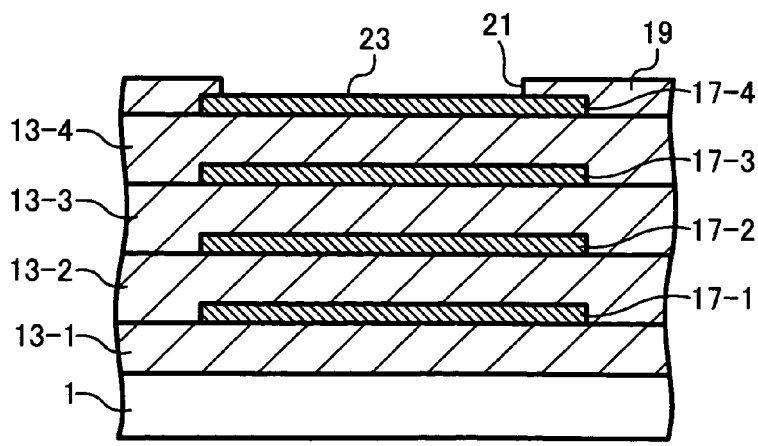
Figure 3A:
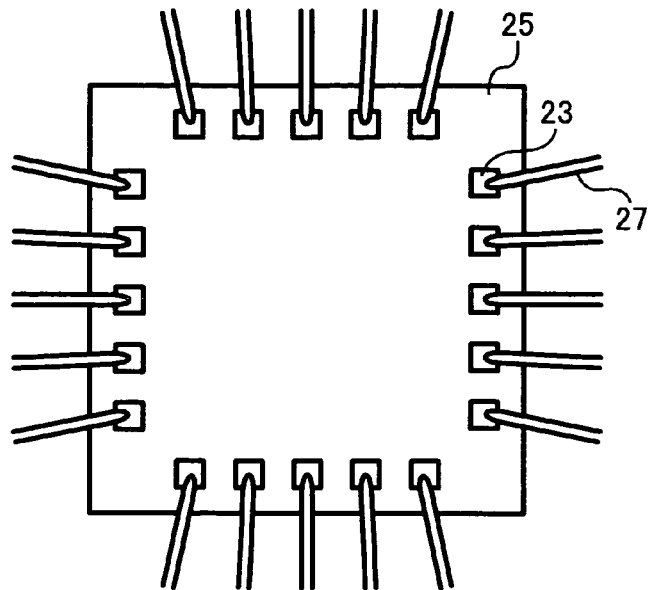
FIGS. 3A-3C are illustration for explaining a wafer test.
Figure 3B:
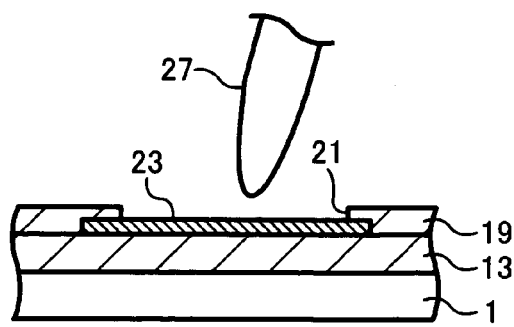
Figure 3C:
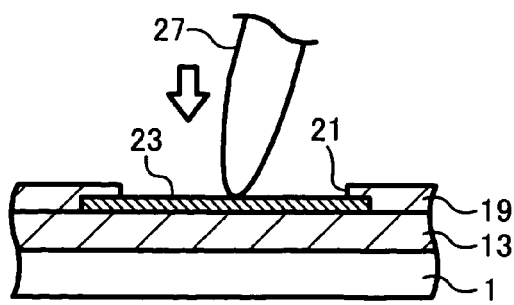
Figure 4:
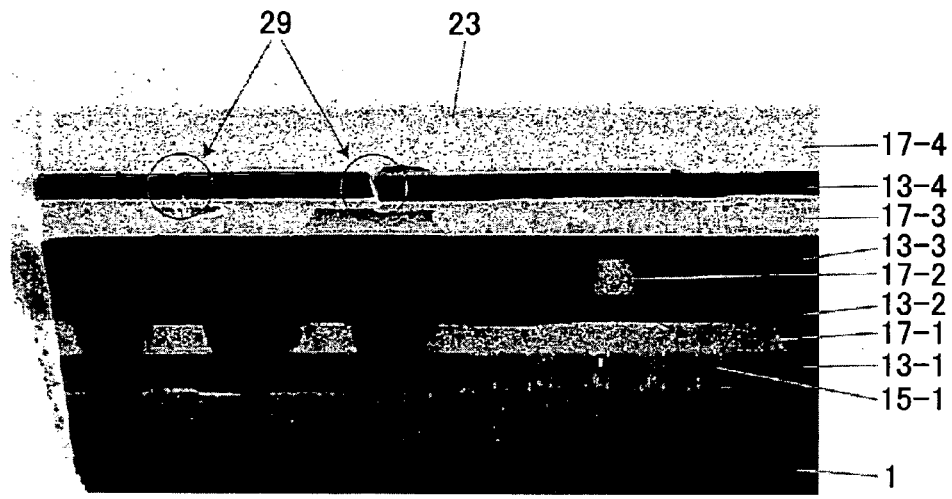
FIG. 4 is a microphotograph for explaining a generation of cracks in an interlayer insulation film by an impact on an electrode pad.
Figure 5A:
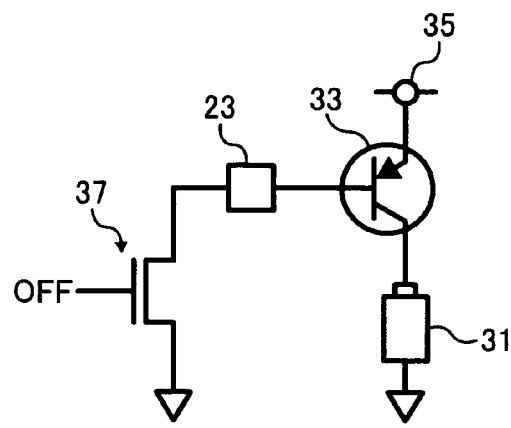
FIGS. 5A and 5B are circuit diagrams for explaining operations of a driver transistor.
Figure 5B:
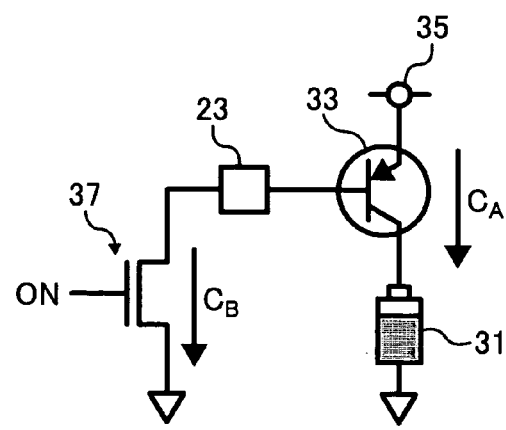
Figure 6A:
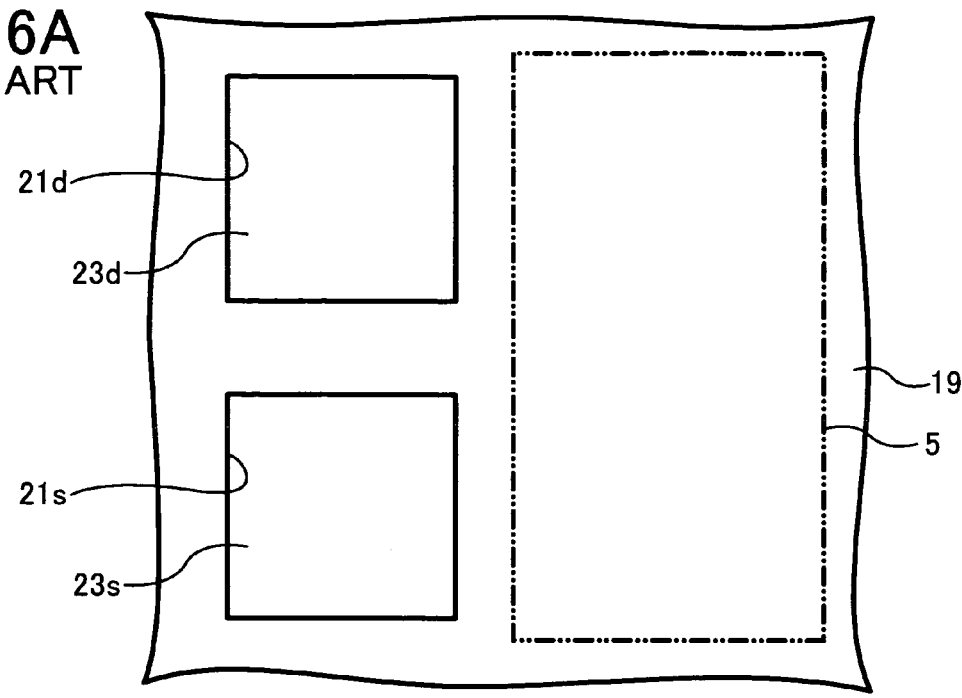
FIGS. 6A-6C are schematic diagrams of another related-art semiconductor apparatus.
Figure 6B:
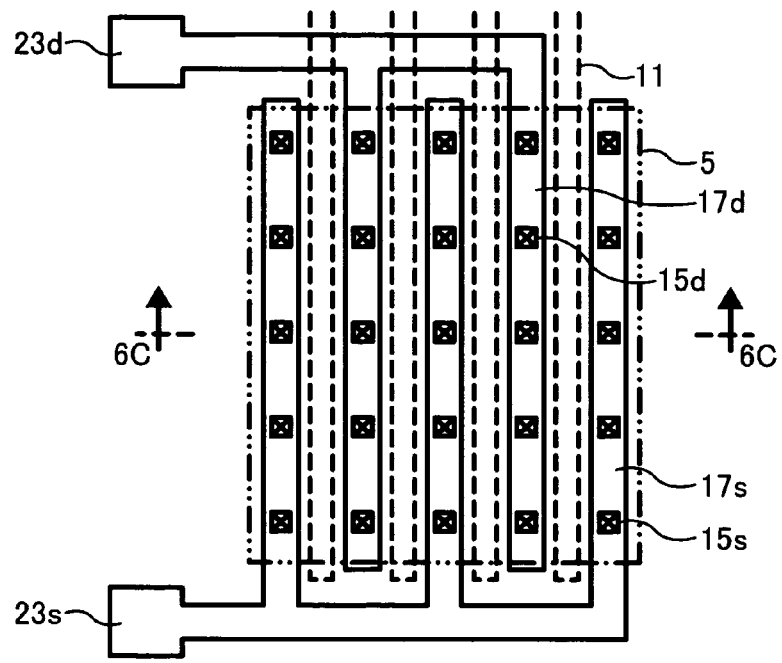
Figure 6C:
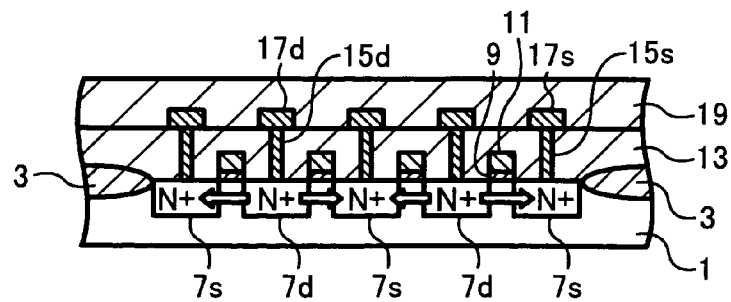
Figure 7A:
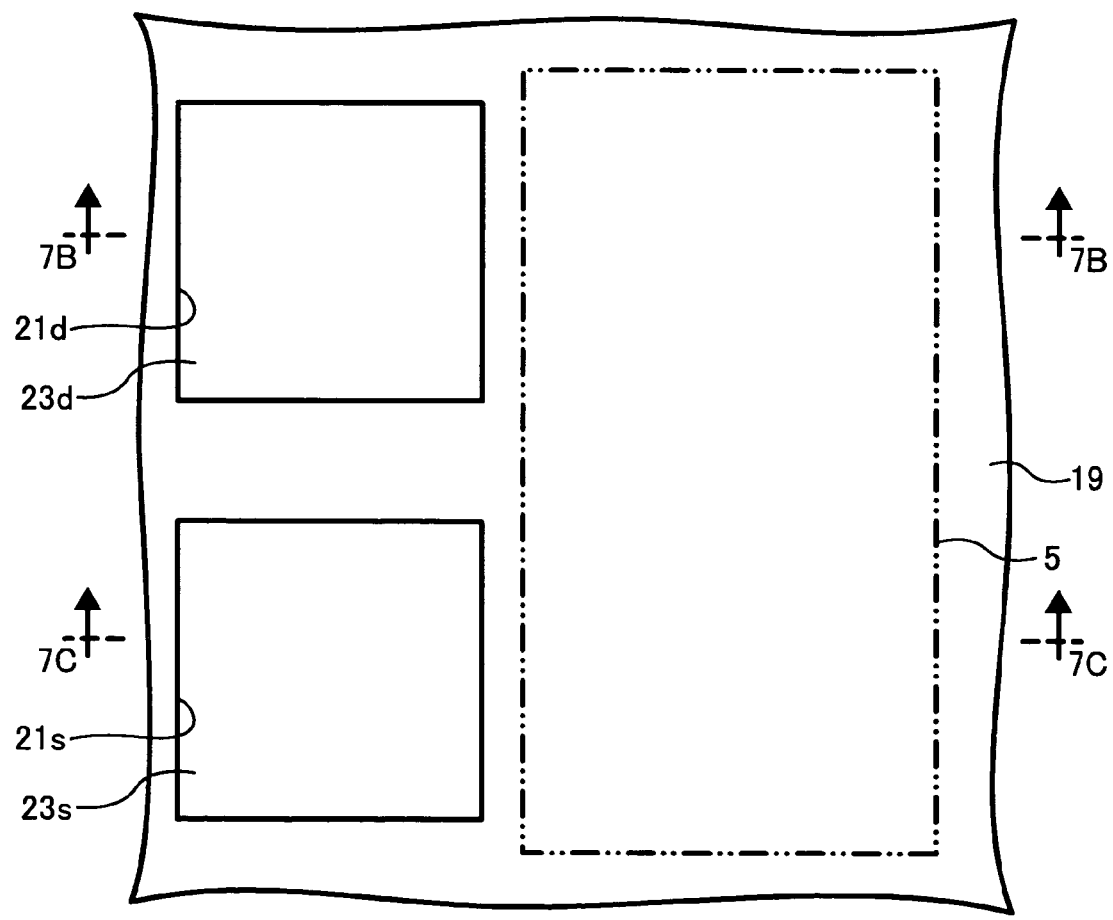
FIGS. 7A-7C are schematic diagrams of another related-art semiconductor apparatus.
Figure 7B:
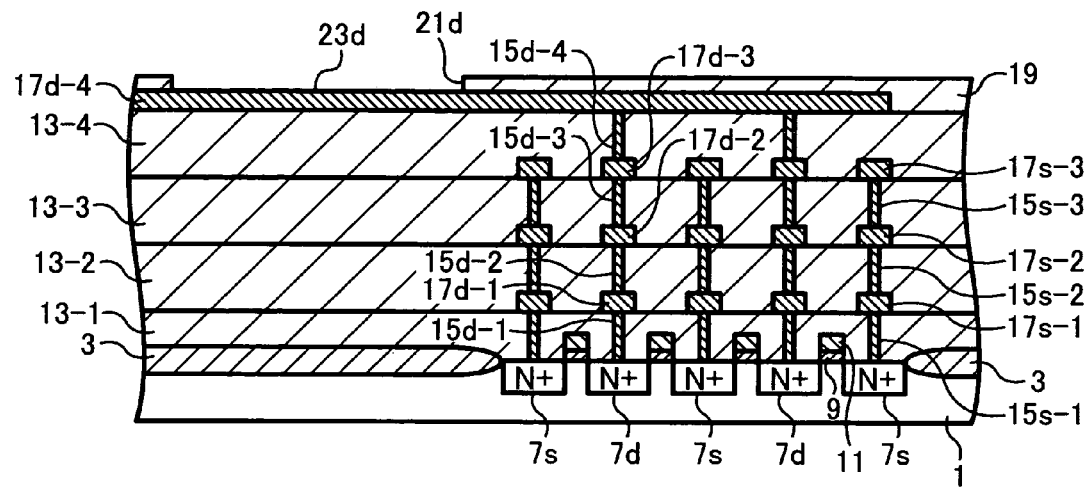
Figure 7C:
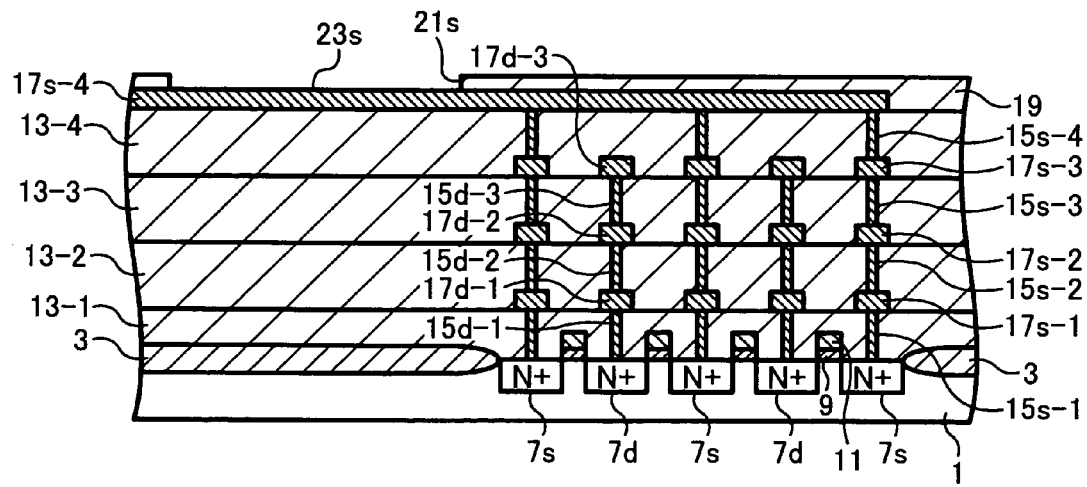
Figure 8A:
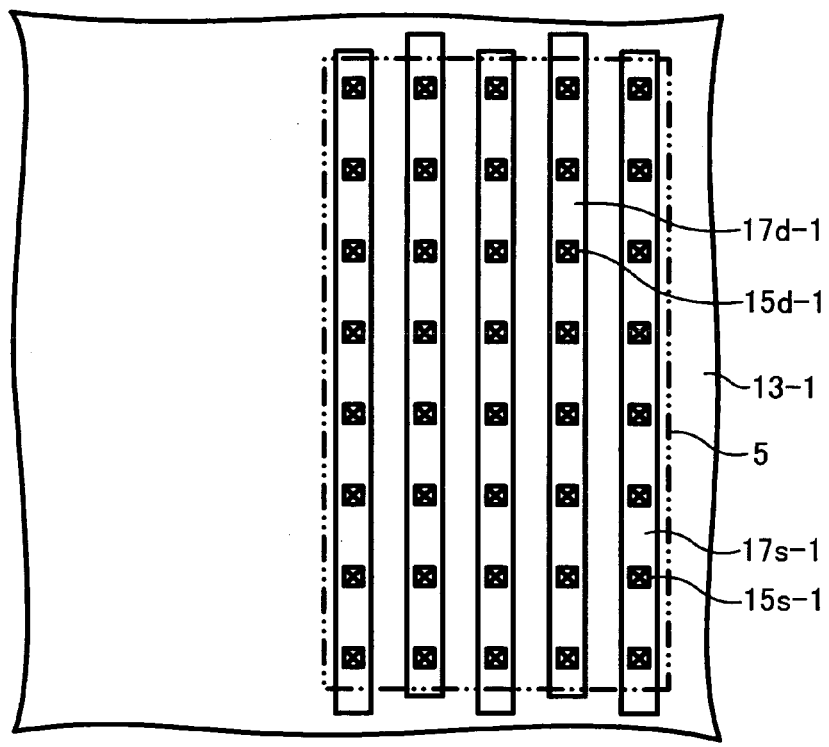
FIGS. 8A and 8B are schematic diagrams illustrating first and second metal-wiring layers, respectively.
Figure 8B:
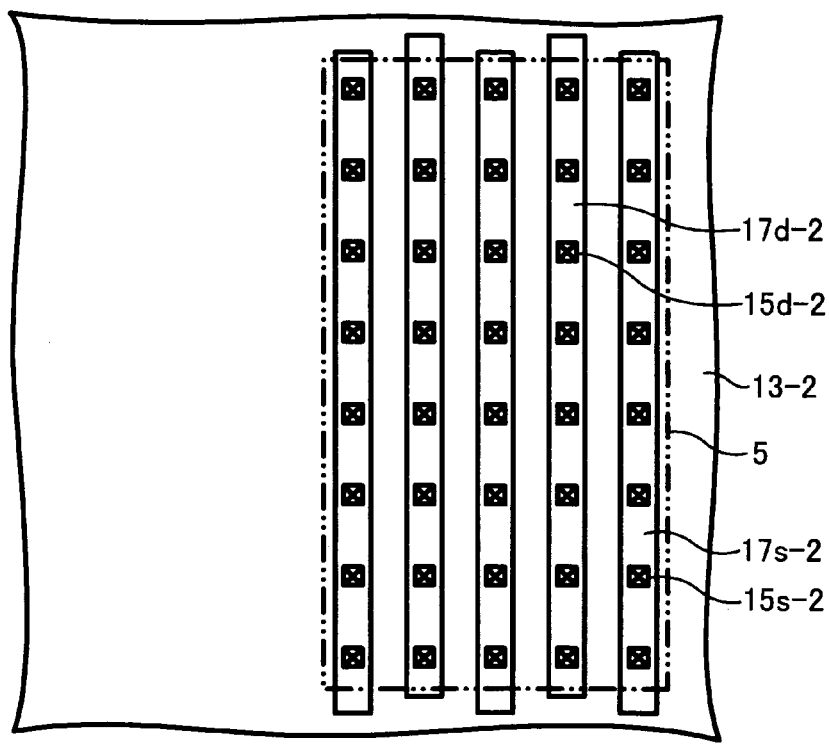
Figure 9A:
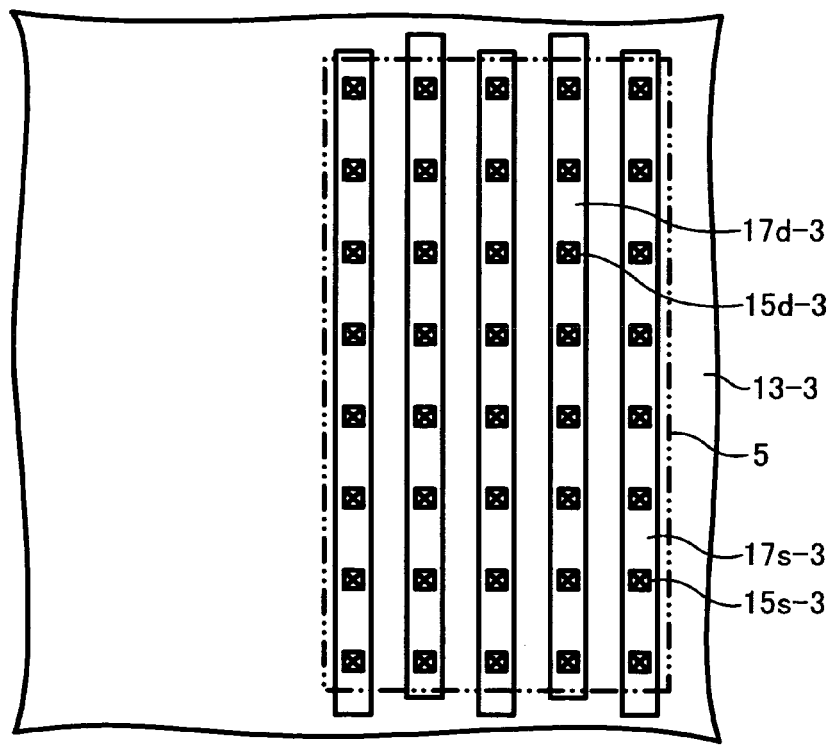
FIGS. 9A and 9B are schematic diagrams illustrating third and fourth metal-wiring layers, respectively.
Figure 9B:
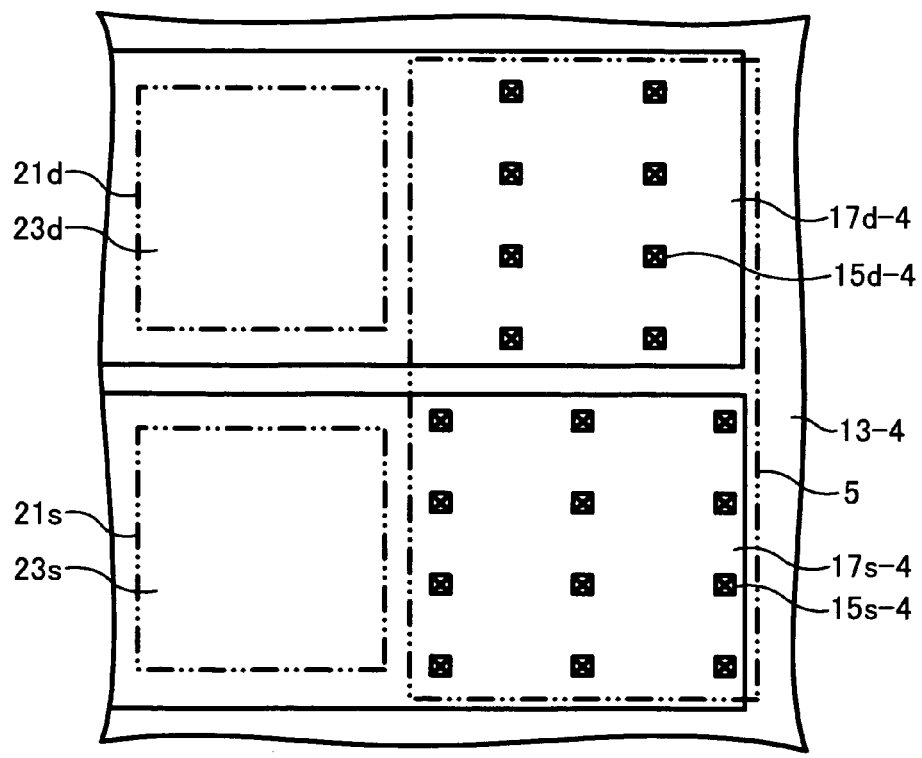
Figure 10A:
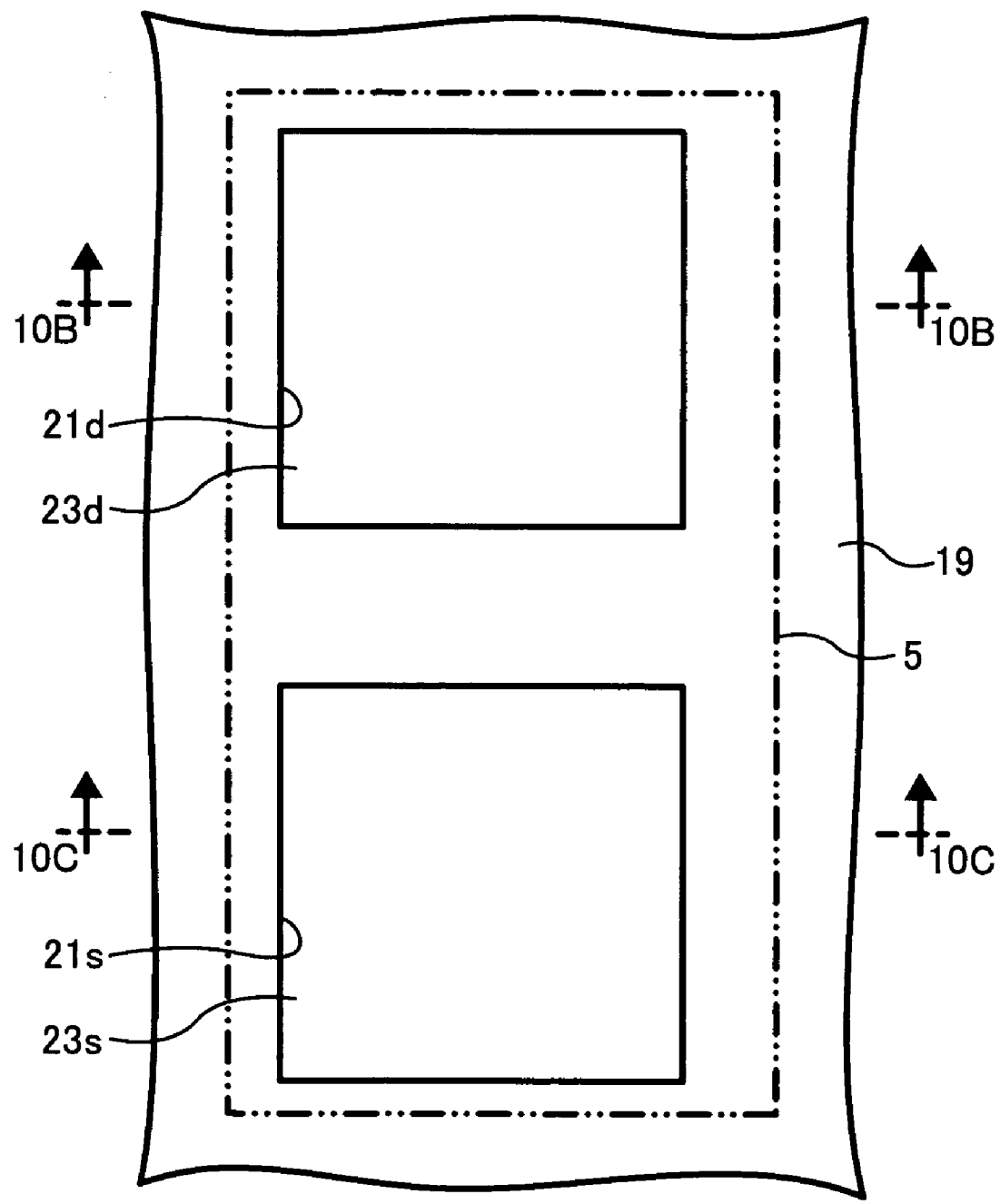
FIGS. 10A-10C are schematic diagrams of another related-art semiconductor apparatus.
Figure 10B:
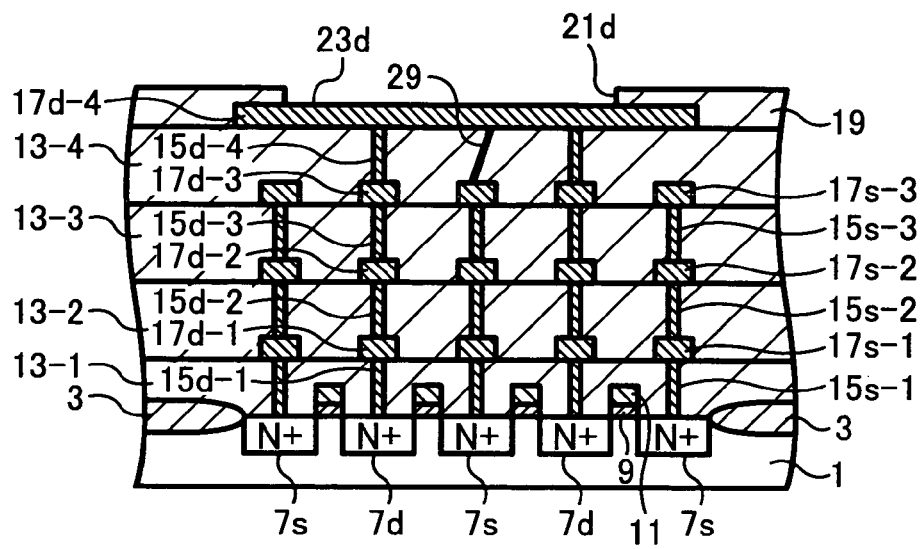
Figure 10C:
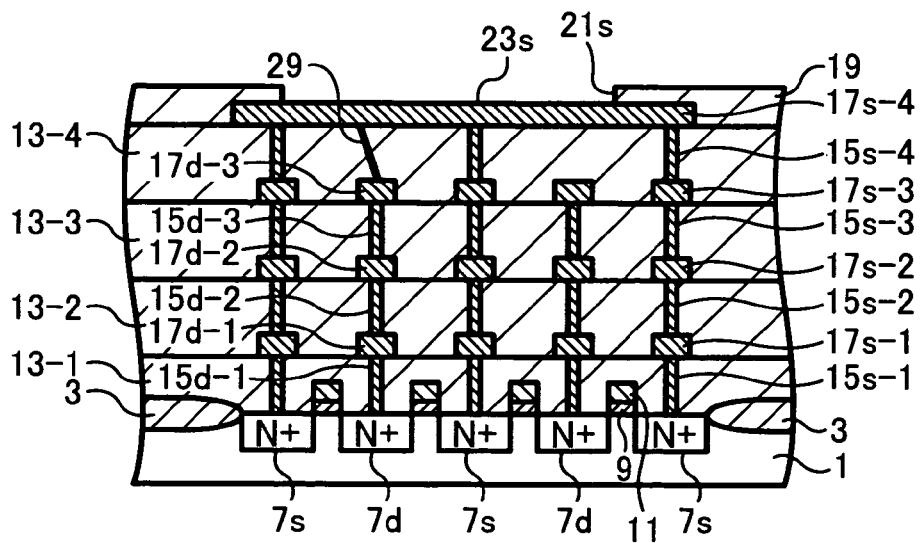

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

It will be understood that if an element or layer is referred to as being "on", "against", "connected to" or "coupled to", another element or layer, and then it can be directly on, against, connected or coupled to the other element or layer, or intervening elements or layers may be present. In contrast, if an element is referred to as being "directly on", "directly connected to" or "directly coupled to" another element or layer, and then there are no intervening elements or layers present. Like numbers referred to like elements throughout. As used herein, the term "and/or" includes any and all combinations of one or more of the associated listed items.

Spatially relative terms, such as "beneath", "below", "lower", "above", "upper" and the like may he used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements describes as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors herein interpreted accordingly.

Although the terms first, second, etc. may be used herein to described various elements, components, regions, layers and/or sections, it should be understood that these elements, components, regions, layer and/or sections should not be limited by these terms. These terms are used only to distinguish one element, component, region, layer or section from another region, layer or section. Thus, a first element, component, region, layer or section discussed below could be termed a second element, component, region, layer or section without departing from the teachings of the present disclosure.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Figure 11A:
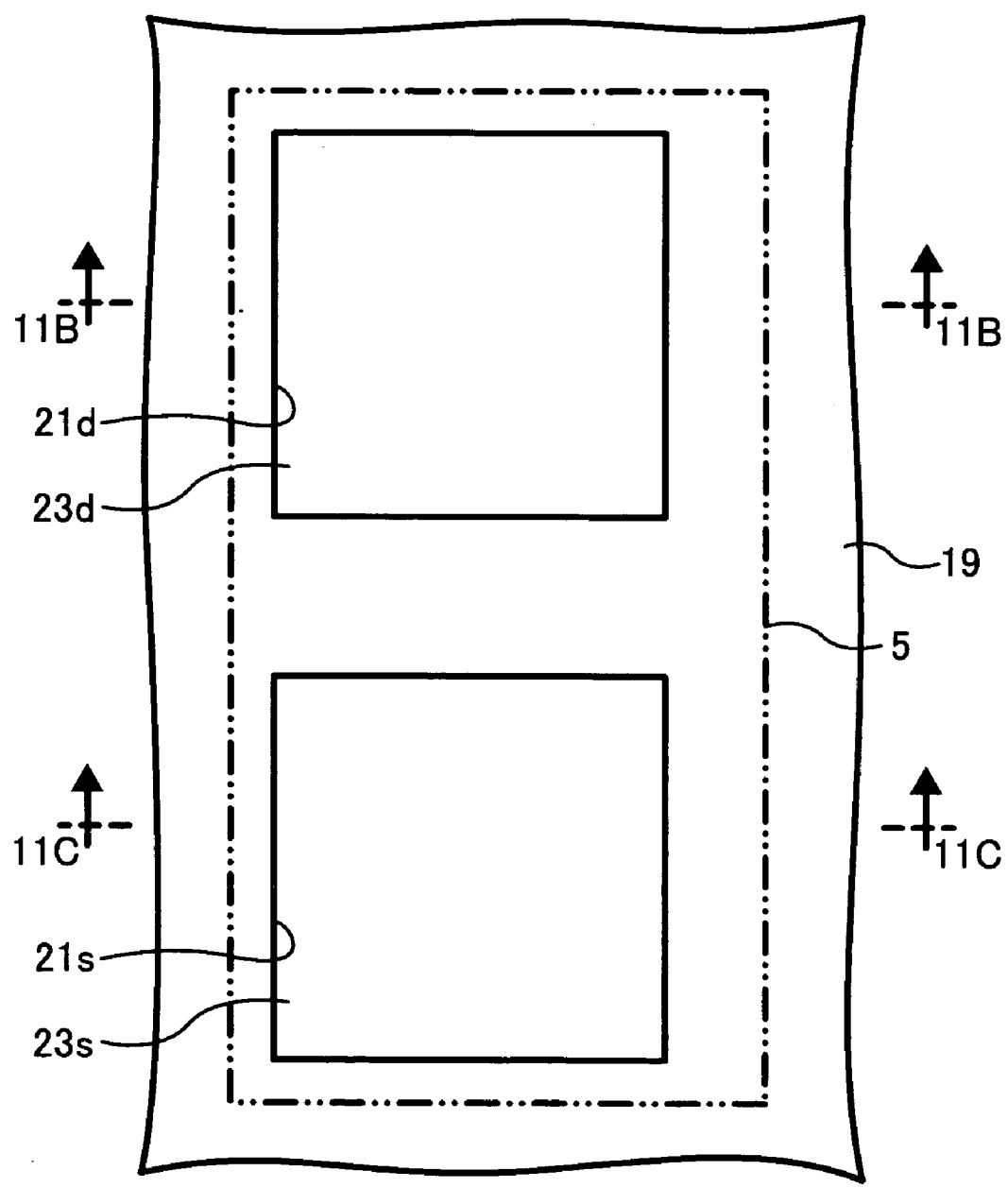
FIG. 11A is a top view of a semiconductor apparatus according an exemplary embodiment.
Figure 11B:
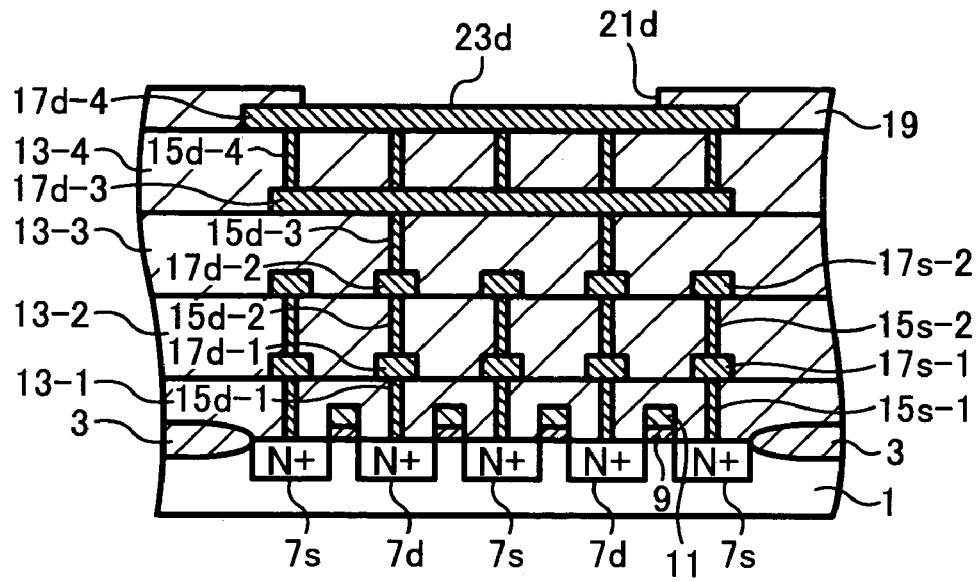
FIG. 11B is a cross-sectional side view taken in an A-A line in FIG. 11A.
Figure 11C:
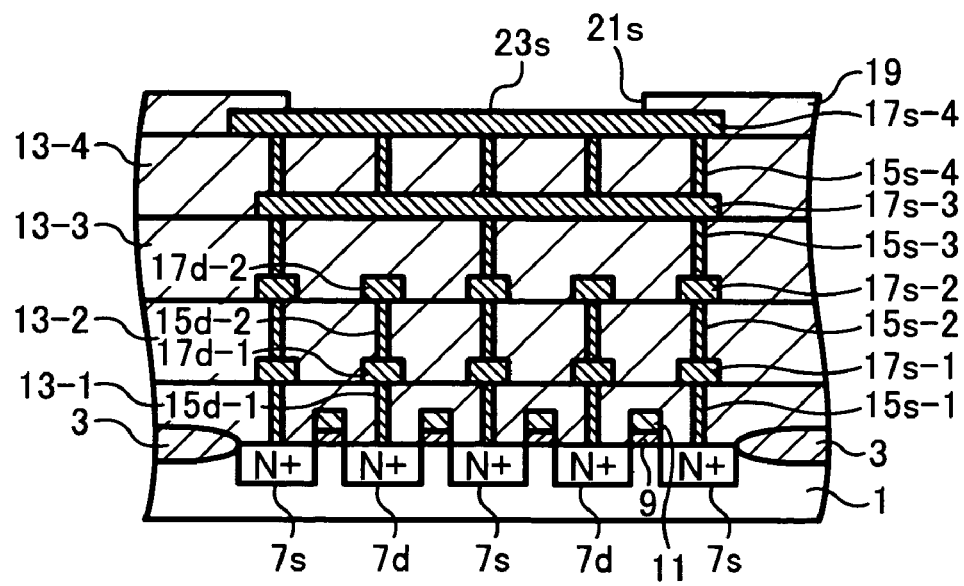
FIG. 11C is a cross-sectional side view taken in a B-B line in FIG. 11A.

Referring now to the drawings, wherein like reference numerals designate identical or corresponding parts throughout the several views, particularly to FIGS. 11A-11C, 12A and 12B, and 13A and 13B, a semiconductor apparatus 100 according to an exemplary embodiment to the present disclosure is explained. The semiconductor apparatus 100 has a four-metal-wiring-layer structure. As illustrated in FIGS. 11B and 11C, the semiconductor apparatus 100 includes a substrate 1 on which a LOCOS (local oxidation of silicon) oxide film 3. This substrate 1 is made of a P-type silicon, for example, and the LOCOS oxide file 3 delimits an area 5 in which driver transistors are formed. The area 5 may be referred to as a driver transistor formation area. Within the area 5, a plurality of sources 7s and a plurality of drains 7d are alternately arranged with a predetermined spacing, as illustrated in FIGS. 11B and 11C. These sources 7s and drains 7d are formed of N-type impurities, for example. Each of the sources 7s is referred to as a first electrode and each of the drains 7d is referred to as a second electrode. Between the sources 7s and the drains 7d on the substrate 1, a gate electrode 11 made of a polysilicon is formed via a gate oxide film 9.

An entire surface of the substrate 1 including a formation area of the sources 7s, the drains 7d, and the gate electrodes 11 is covered by a BPSG (boro-phospho silicate glass) film 13-1. The BPSG film 13-1 on the source 7s is provided with a contact hole 15s-1. The BPSG film 13-1 on the drain 7d is provided with a contact hole 15d-1. Although it is not illustrated, there is an area where an interlayer insulation film formed on the gate electrode 11 is provided with a contact hole.

Figure 12A:
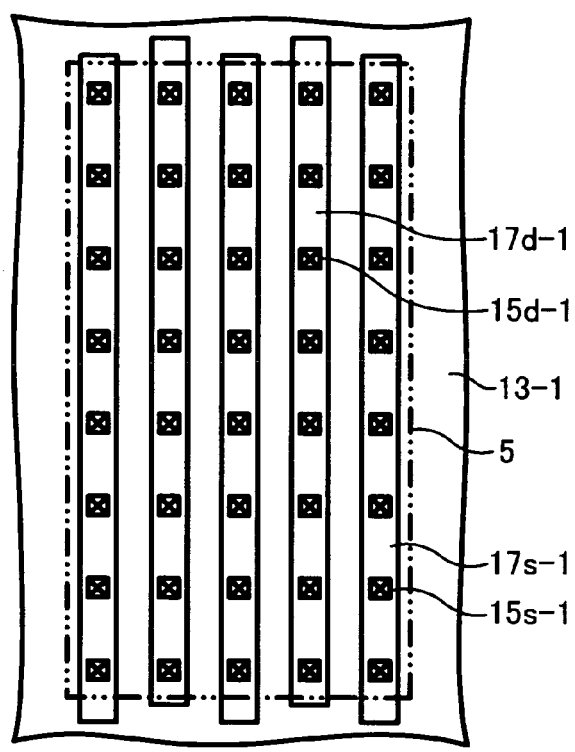
FIG. 12A is a top view of a first metal-wiring layer of the semiconductor apparatus of FIG. 11A.

Referring to FIG. 12A, formation of a first metal-wiring layer is explained. A first metal-wiring layer 17s-1 is formed on the BPSG film 13-1 over the source 7s in an area including a formation area of the contact hole 15s-1. The first metal-wiring layer 17s-1 is electrically connected to the source 7s via the contact hole 15s-1.

A first metal-wiring layer 17d-1 is formed on the BPSG film 13-1 over the drain 7d in an area including a formation area of the contact hole 15d-1. The first metal-wiring layer 17d-1 is electrically connected to the drain 7d via the contact hole 15d-1.

Although it is not shown, a metal-wiring layer is formed on the BPSG film 13-1 over the gate electrode 11 in an area including a formation area of the contact hole provided on the gate electrode 11. The plurality of gate electrodes 11 are electrically connected to each other via the contact holes and the metal-wiring layer.

A first interlayer insulation film 13-2 is formed on the BPSG film 13-1 in an area including formation areas of the first metal-wiring layers 17s-1 and 17d-1. A through-hole 15s-2 is formed in the first interlayer insulation film 13-2 provided on the first metal-wiring layer 17s-1. Also, a through-hole 15d-2 is formed in the first interlayer insulation film 13-2 provided on the first metal-wiring layer 17d-1.

Figure 12B:
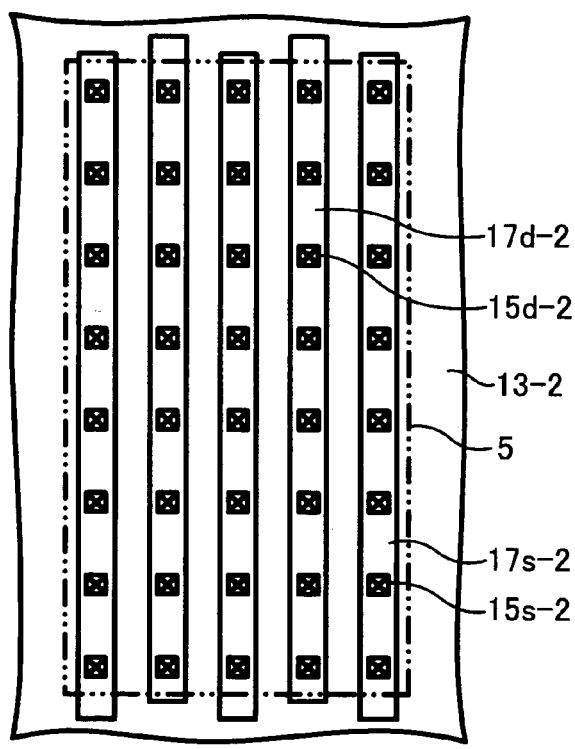
FIG. 12B is a top view of a second metal-wiring layer of the semiconductor apparatus of FIG. 11A.

Referring to FIG. 12B, formation of a second metal-wiring layer is explained. A second metal-wiring layer 17s-2 is formed on the first interlayer insulation film 13-2 over the first metal-wiring layer 17s-1 in an area including a formation area of the through-hole 15s-2. The second metal-wiring layer 17s-2 is electrically connected to the first metal-wiring layer 17s-1 via the through-hole 15s-2.

A second metal-wiring layer 17d-2 is formed on the first interlayer insulation film 13-2 over the first metal-wiring layer 17d-1 in an area including a formation area of the through-hole 15d-2. The second metal-wiring layer 17d-2 is electrically connected to the first metal-wiring layer 17d-1 via the through-hole 15d-2.

A second interlayer insulation film 13-3 is formed on the first interlayer insulation film 13-2 in an area including formation areas of the second metal-wiring layers 17s-2 and 17d-2. A through-hole 15s-3 is formed in the second interlayer insulation film 13-3 provided on the second metal-wiring layer 17s-2. Also, a through-hole 15d-3 is formed in the second interlayer insulation film 13-3 provided on the second metal-wiring layer 17d-2.

Figure 13A:
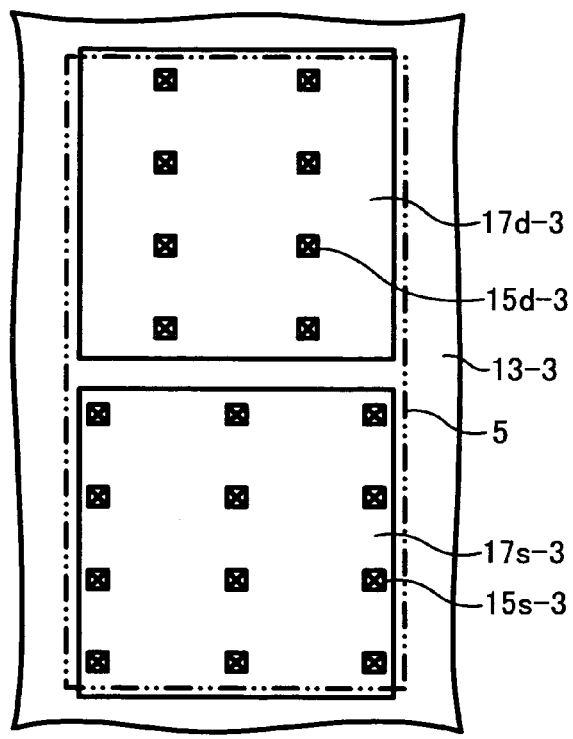
FIG. 13A is a top view of a third metal-wiring layer of the semiconductor apparatus of FIG. 11A.

Referring to FIG. 13A, formation of a third metal-wiring layer is explained. A third metal-wiring layer 17s-3 is formed on the second interlayer insulation film 13-3 over the second metal-wiring layer 17s-2 in an area including a formation area of the through-hole 15s-3. The third metal-wiring layer 17s-3 is electrically connected to the second metal-wiring layer 17s-2 via the through-hole 15s-3.

A third metal-wiring layer 17d-3 is formed on the second interlayer insulation film 13-3 over the second metal-wiring layer 17d-2 in an area including a formation area of the through-hole 15d-3. The third metal-wiring layer 17d-3 is electrically connected to the second metal-wiring layer 17d-2 via the through-hole 15d-3.

The third metal-wiring layers 17s-3 and 17d-3 are formed over a plurality of second metal-wiring layers 17s-2 and a plurality of second metal-wiring layers 17d-2, that is, the plurality of sources 7s and the plurality of drains 7d.

A third interlayer insulation film 13-4 is formed on the second interlayer insulation film 13-3 in an area including formation areas of the third metal-wiring layers 17s-3 and 17d-3. A through-hole 15s-4 is formed in the third interlayer insulation film 13-4 provided on the third metal-wiring layer 17s-3. Also, a through-hole 15d-4 is formed in the third interlayer insulation film 13-4 provided on the third metal-wiring layer 17d-3.

Figure 13B:
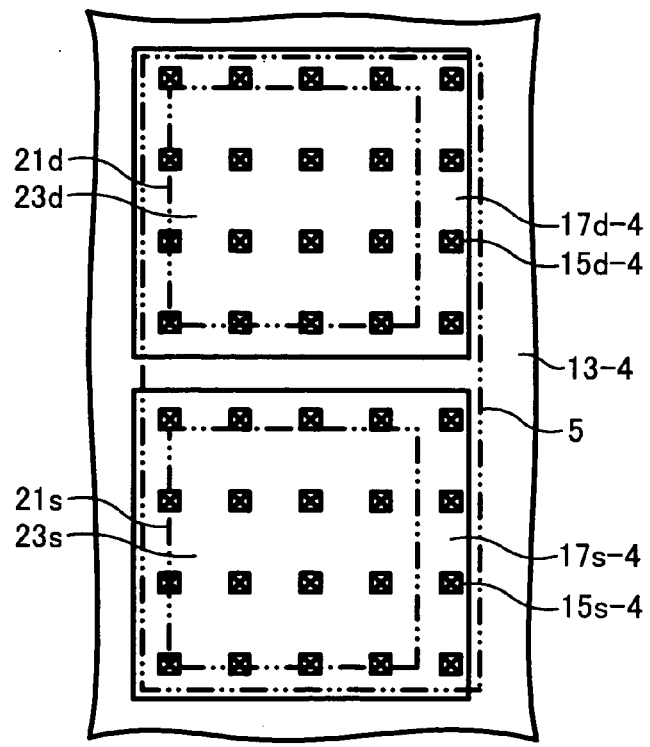
FIG. 13B is a top view of a fourth metal-wiring layer of the semiconductor apparatus of FIG. 11A.

Referring to FIG. 13B, formation of a fourth metal-wiring layer is explained. A fourth metal-wiring layer 17s-4 is formed on the third interlayer insulation film 13-4 over the third metal-wiring layer 17s-3 in an area including a formation area of the through-hole 15s-4. The fourth metal-wiring layer 17s-4 is electrically connected to the third metal-wiring layer 17s-3 via the through-hole 15s-4.

A fourth metal-wiring layer 17d-4 is formed on the third interlayer insulation film 13-4 over the third metal-wiring layer 17d-3 in an area including a formation area of the through-hole 15d-4. The fourth metal-wiring layer 17d-4 is electrically connected to the third metal-wiring layer 17d-3 via the through-hole 15d-4.

The fourth metal-wiring layers 17s-4 and 17d-4 form respective uppermost metal-wiring layers.

A final protection film 19 is formed on the third interlayer insulation film 13-4 in an area including formation areas of the fourth metal-wiring layers 17s-4 and 17d-4. A pad opening 21s is formed in the final protection film 19 provided over the fourth metal-wiring layer 17s-4, and a pad opening 21d is formed in the final protection film 19 provided over the fourth metal-wiring layer 17d-4. An area of the fourth metal-wiring layer 17s-4 where the pad opening 21s is made forms an electrode pad 23s which may be referred to as a first electrode pad. Also, an area of the fourth metal-wiring layer 17d-4 where the pad opening 21d is made forms an electrode pad 23d which may be referred to as a second electrode pad.

The electrode pad 23s is electrically connected to the sources 7s via the fourth metal-wiring layer 17s-4, the through-hole 15s-4, the third metal-wiring layer 17s-3, the through-hole 15s-3, the second metal-wiring layer 17s-2, the through-hole 15s-2, the first metal-wiring layer 17s-1, and the contact hole 15s-1.

The electrode pad 23d is electrically connected to the sources 7d via the fourth metal-wiring layer 17d-4, the through-hole 15d-4, the third metal-wiring layer 17d-3, the through-hole 15d-3, the second metal-wiring layer 17d-2, the through-hole 15d-2, the first metal-wiring layer 17d-1, and the contact hole 15d-1.

As described above, the semiconductor apparatus 100 has the structure in which the electrode pad 23s connected to the source 27s of the driver transistor and the electrode pad 23d connected to the drain 27d of the driver transistor are arranged over the driver transistor formation area 5. In other words, the driver transistors which share a relatively large area are arranged under the electrode pads 23s and 23d, thereby reducing a chip size as well as a chip cost.

The third metal-wiring layers 17s-3 and 17d-3, which are arranged lower than the fourth metal-layers 17s-4 and 17d-4 by one layer, are arranged such that the metal-wiring layer 17s-3 connected to the electrode pad 23s is disposed underneath the electrode pad 23s but the metal-wiring layer 17d-3 connected to the electrode pad 23d is not disposed underneath the electrode pad 23s. Thereby, if the third interlayer insulation film 13-4 disposed under the electrode pad 23s has a crack therein, the electrode pad 23s and the third metal-wiring layer 17d-3 may not produce a short circuit.

Similarly, the metal-wiring layer 17d-3 connected to the electrode pad 23d is disposed underneath the electrode pad 23d but the metal-wiring layer 17s-3 connected to the electrode pad 23s is not disposed underneath the electrode pad 23d. Thereby, if the third interlayer insulation film 13-4 disposed under the electrode pad 23d has a crack therein, the electrode pad 23d and the third metal-wiring layer 17s-3 may not produce a short circuit.

In such a way as described above, the respective driver transistors are formed under the electrode pads 23s and 23d, having the source 7s and drain 7s connected to the electrode pads 23s and 23d, respectively, while preventing a short circuit between the source 7s and the drain 7d of the driver transistor.

Furthermore, if a crack is produced under the electrode pads 23s and 23d, the third metal-wiring layers 17s-3 and 17d-3 may stop the crack from growing so that the crack cannot extend to the layers lower than the third metal-wiring layers 17s-3 and 17d-3. This is because the third metal-wiring layers 17s-3 and 17d-3 are formed at an entire area under the electrode pads 23s and 23d, respectively.

In this example, the third metal-wiring layers 17s-3 and 17d-3 are formed under the electrode pads 23s and 23d, respectively, but are not limited thereto.

For example, the third metal-wiring layers 17s-3 and 17d-3 may be formed at least under portions of the electrode pads 23s and 23d, respectively, where a metal probe touches during a wafer test. This approach may prevent a creation of cracks under the third metal-wiring layers 17s-3 and 17d-3.

However, the formation of the third metal-wiring layers 17s-3 and 17d-3 is not limited to the above-mentioned arrangement. That is, the third metal-wiring layers 17s-3 and 17d-3 may be formed under the electrode pads 23s and 23d, respectively, except portions thereof where a metal probe touches during a wafer test.

Next, a different arrangement of the third metal-wiring layers according to another exemplary embodiment of the present disclosure is explained with reference to FIGS. 14A and 14B. In this explanation, it is supposed that portions other than the third metal-wiring layers remain same.

Figure 14A:
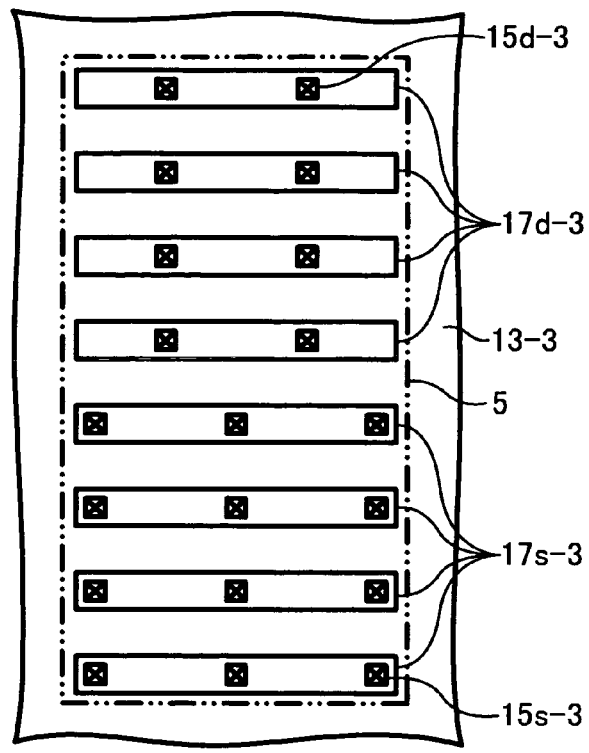
FIGS. 14A and 14B are top views of the third metal-wiring layers with different arrangements according to other embodiments.
Figure 14B:
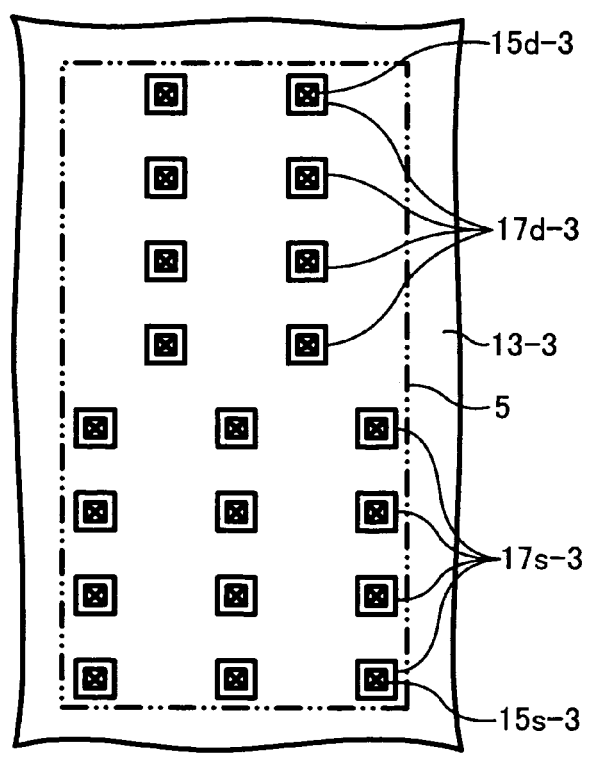

The third metal-wiring layers 17s-3 and 17d-3 may be arranged, for example, in a stripe formation, as shown in FIG. 14A, or an island formation, as shown in FIG. 14B.

In any one of these formations, the third metal-wiring layer 17s-3 is arranged under the electrode pad 23s but the third metal-wiring layer 17d-3 is not disposed under the electrode pad 23s, and the third metal-wiring layer 17d-3 is arranged under the electrode pad 23d but the third metal-wiring layer 17s-3 is not disposed under the electrode pad 23d. This structure can prevent occurrence of short circuits between the electrode pad 23s and the third metal-wiring layer 17d-3 and between the electrode pad 23d and the third metal-wiring layer 17s-3 when a crack is created in the third interlayer insulation film 13-4 disposed under the electrode pads 23s and 23d.

In short, this example simply avoids an arrangement of the third metal-wiring layer 17d-3 under the electrode pad 23s and an arrangement of the third metal-wiring layer 17s-3 under the electrode pad 23d. Therefore, the third metal-wiring layers 17s-3 and 17d-3 can freely be arranged as long as the above-mentioned simple preference of arrangement is maintained.

Figure 15A:
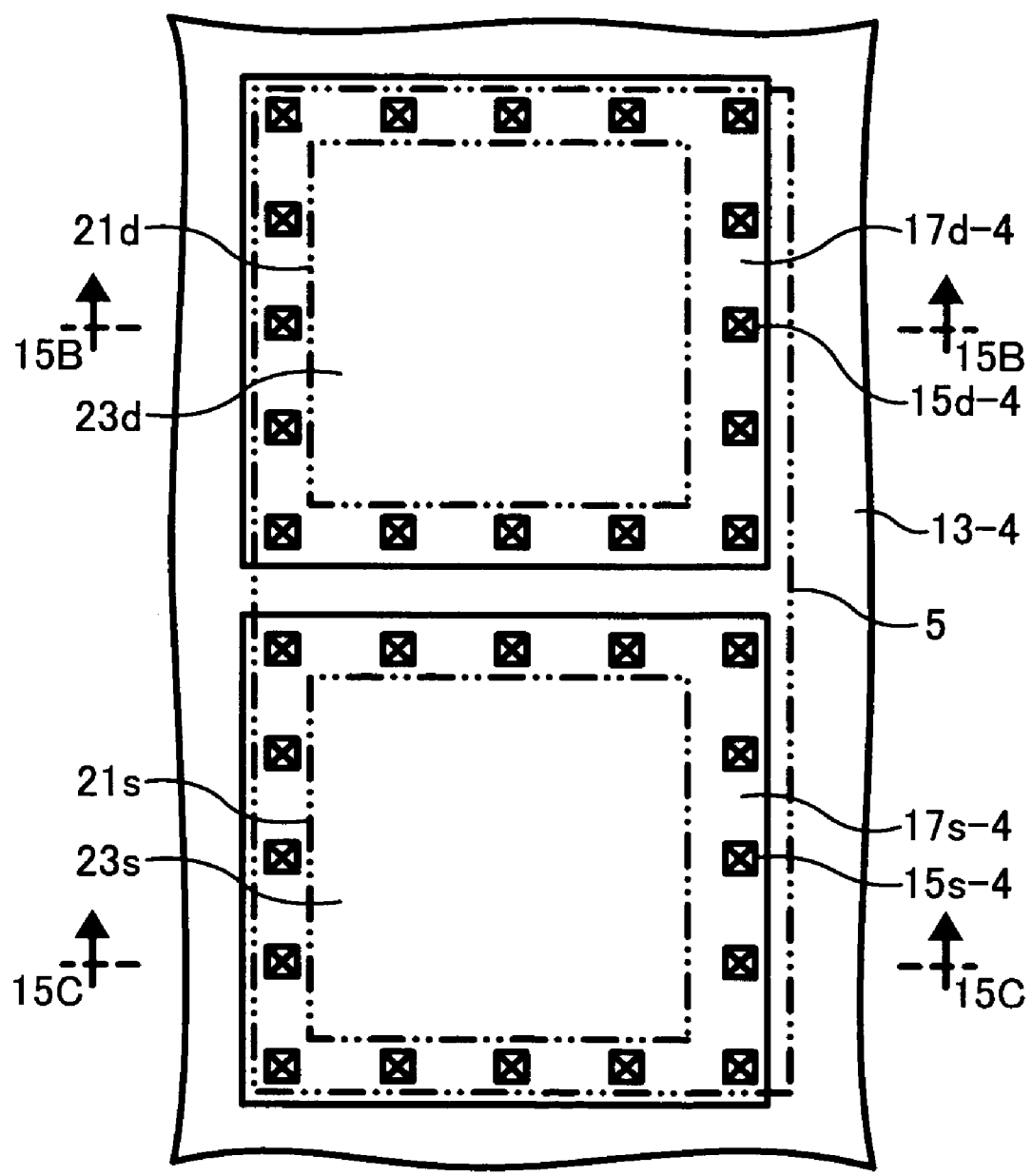
FIG. 15A is a top view of the fourth metal-wiring layer and through holes with a different arrangement according to another embodiment.

Next, a different arrangement of the through hole formed in the fourth metal-wiring layers is explained with reference to FIGS. 15A-15C. In this explanation, it is supposed that portions other than the through hole formed in the fourth metal-wiring layers remain same.

In a vicinity of the electrode pad 23s, the fourth metal-wiring layer 17s-4 and the third metal-wiring layer 17s-3 are formed in a plate-like shape having an area greater than the pad opening 21s. Also, in a vicinity of the electrode pad 23d, the fourth metal-wiring layer 17d-4 and the third metal-wiring layer 17d-3 are formed in a plate-like shape having an area greater than the pad opening 21d.

The through hole 15s-4 is formed around a rim of the electrode pad 23s, and is configured to connect the fourth metal-wiring layer 17s-4 to the third metal-wiring layer 17s-3. Similarly, the through hole 15d-4 is formed around a rim of the electrode pad 23d, and is configured to connect the fourth metal-wiring layer 17d-4 to the third metal-wiring layer 17d-3.

In this example, the through hole 15s-4 is formed around a rim of the electrode pad 23s and is not formed directly under the electrode pad 23s so that an impact given to the electrode pad 23s may not be transmitted to the structure under the electrode pad 23s through the metal materials implanted in the through hole 15s-4. Similarly, the through hole 15d-4 is formed around a rim of the electrode pad 23d and is not formed directly under the electrode pad 23d so that an impact given to the electrode pad 23d may not be transmitted to the structure under the electrode pad 23d through the metal materials implanted in the through hole 15d-4.

Figure 15B:
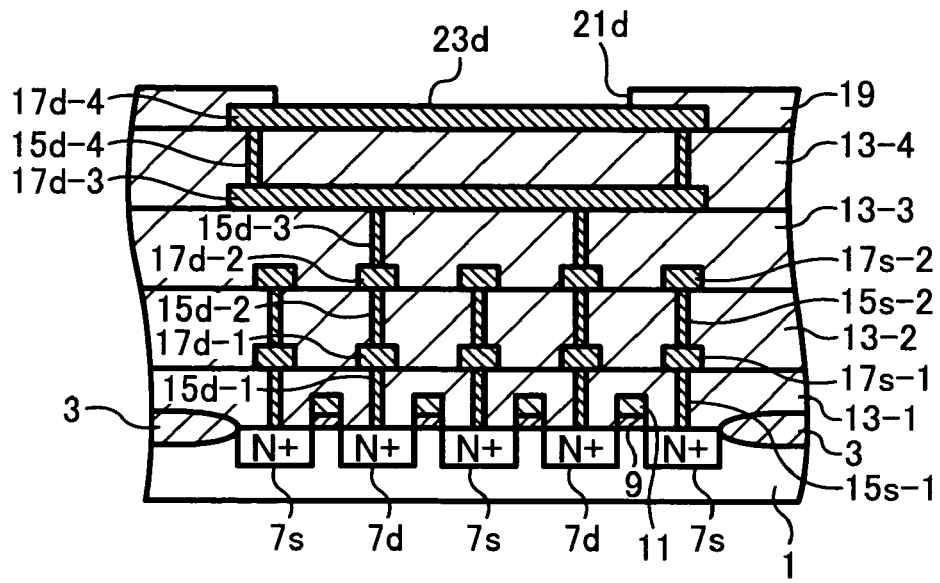
FIG. 15B is a cross-sectional side view taken in an A-A line of FIG. 15A.
Figure 15C:
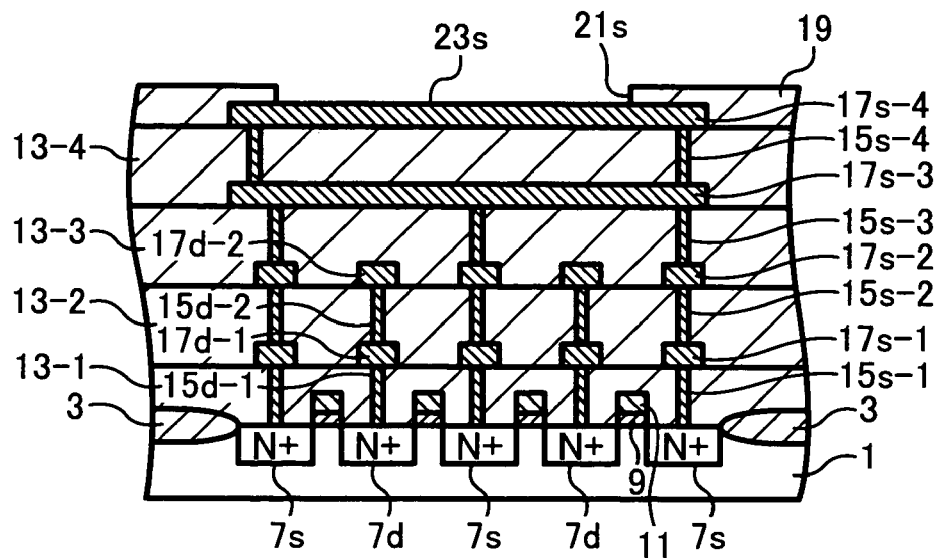
FIG. 15C is a cross-sectional side view taken in an B-B line of FIG. 15A.
Figure 16A:
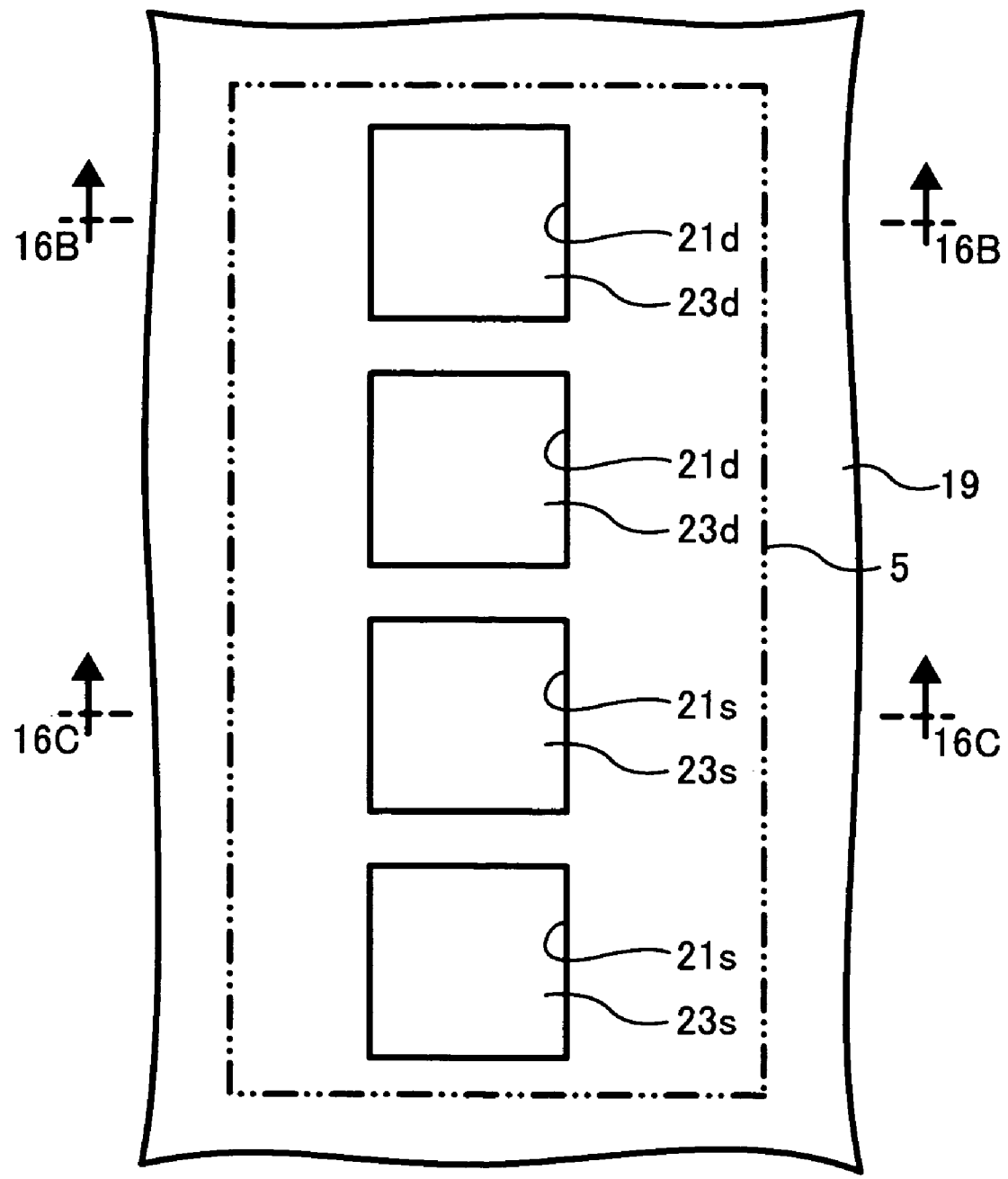
FIG. 16A is a top view of a semiconductor apparatus having a plurality of pad openings for each of source and drain according to another embodiment.
Figure 16B:
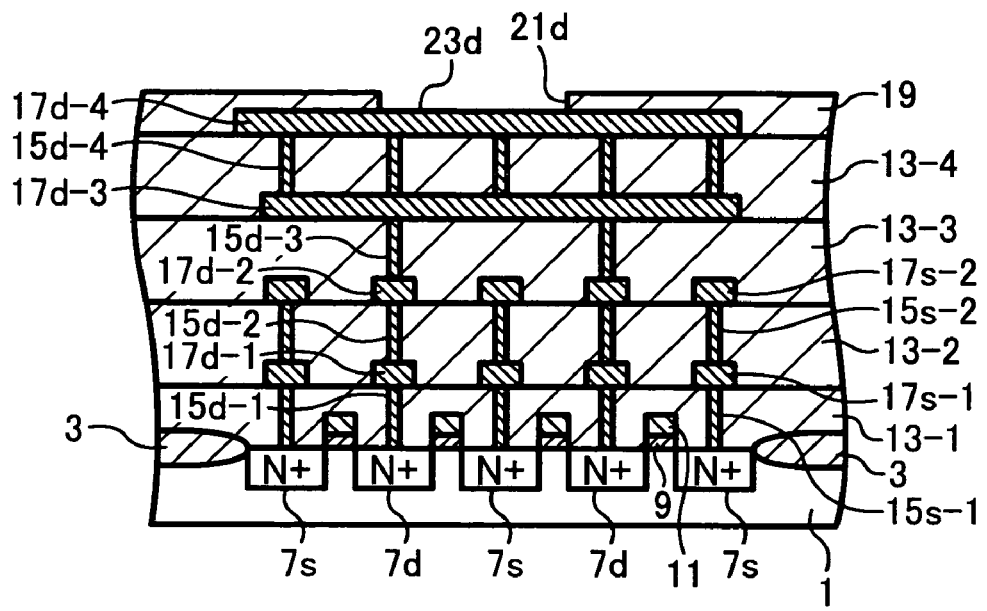
FIG. 16B is a cross-sectional side view taken in an A-A line of FIG. 16A.
Figure 16C:
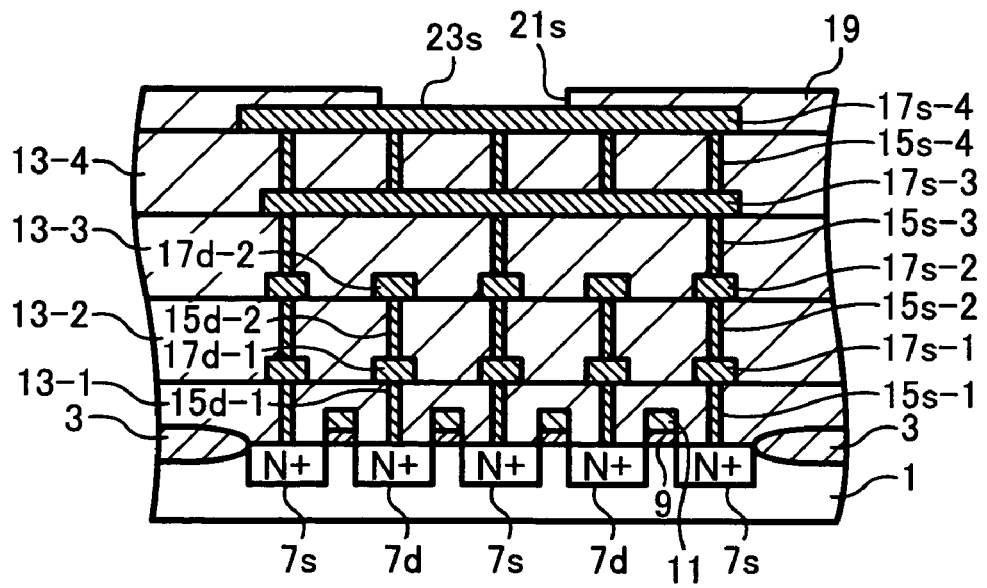
FIG. 16C is a cross-sectional side view taken in an B-B line of FIG. 16A.

In this example, the third metal-wiring layers 17d-3 and 17s-3 are formed in a plate-like shape, as illustrated in FIGS. 15B and 15C, respectively. However, their shapes are not limited to the plate-like shape. For example, they may be in a stripe shape, as shown in FIG. 14A. In this case, also, the through holes 15s-4 and 15d-4 need to be arranged not directly under the electrode pads 23s and 23d but around a rim of the electrode pads 23s and 23d, respectively.

Next, a different arrangement of the electrode pads is explained with reference to FIGS. 16A-16C, and 17AB and 17B. In this explanation, it is supposed that the first and second metal-wiring layers are similar to those of FIGS. 12A and 12B and that the third and fourth metal-wiring layers are similar to those of FIGS. 13A and 13B.

Two pad openings 21s are formed on the fourth metal-wiring layer 17s-4 and accordingly two electrode pads 23s are formed in the pad openings 21s. Similarly, two pad openings 21d are formed on the fourth metal-wiring layer 17d-4 and accordingly two electrode pads 23d are formed in the pad openings 21d.

In this way, two or more electrode pad 23s and/or 23d can be formed in the driver transistor formation area 5.

It should be now noted that the driver transistor can generally increase an amount of current flow as an increase of a channel width. On the other hand, a metal-wiring layer has a maximum allowable current amount which is determined by factors such as a material, a structure, a size, etc. If a metal-wiring layer allows a flow of a current exceeding such a maximum allowable current amount, the metal-wiring layer is melted and broken. In other words, a driver transistor with a channel of a relatively large width may cause an overcurrent flow exceeding the maximum allowable current amount in the metal-wiring layer.

Figure 17A:
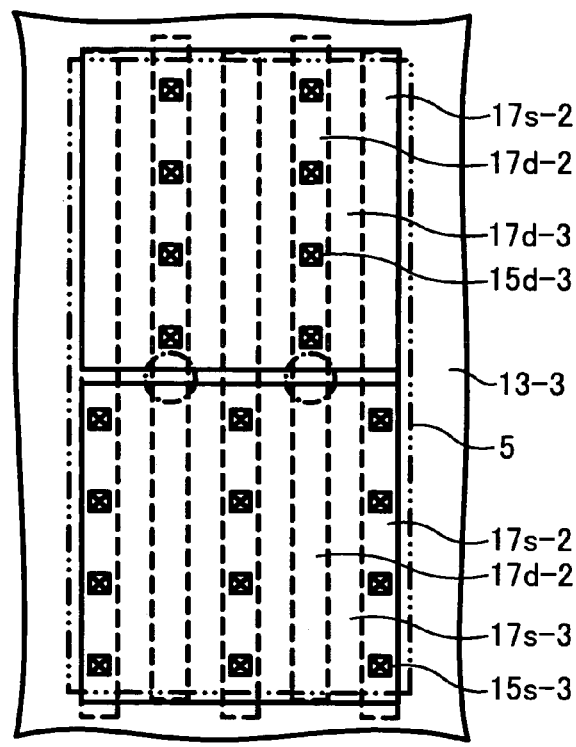
FIG. 17A is a top view of the third metal-wiring layer of the semiconductor apparatus of FIG. 16A.
Figure 17B:
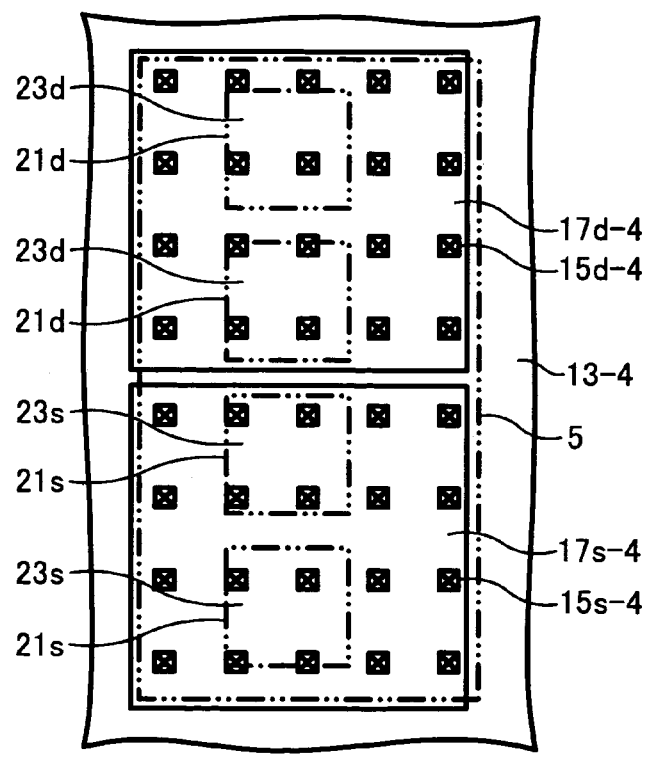
FIG. 17B is a top view of the fourth metal-wiring layer of the semiconductor apparatus of FIG. 16A.

For example, in FIG. 17A, a current flowing into the second metal-wiring layer 17$d$-2 via the through hole 15$d$-3 goes around to an area under the third metal-wiring layer 17$s$-3 which has no through hole. In the second metal-wiring layer 17$d$-2, a current flowing through an area under the third metal-wiring layer 17$s$-3 is caused to pass through a portion, encircled by an alternate long and short dashed line, where an electro-current constriction occurs as a consequence. Such an electro-current constriction may occur in the second metal-wiring layer 17$s$-2 in a similar manner.

This phenomenon may become more remarkable as the channel width increases. Therefore, the background art needs to intentionally provide the driver transistor with a large channel width with a thick stripe width of the second metal-wiring layers 17$s$-2 and 17$d$-2. This leads a further increase of chip size.

Another example aiming to solve the above-described problem of electro-current constriction is explained with reference to FIGS. 18A-18C, and 19A and 19B. In this example, the first and second metal-wiring layers are similar to those of FIGS. 12A and 12B.

Figure 18A:
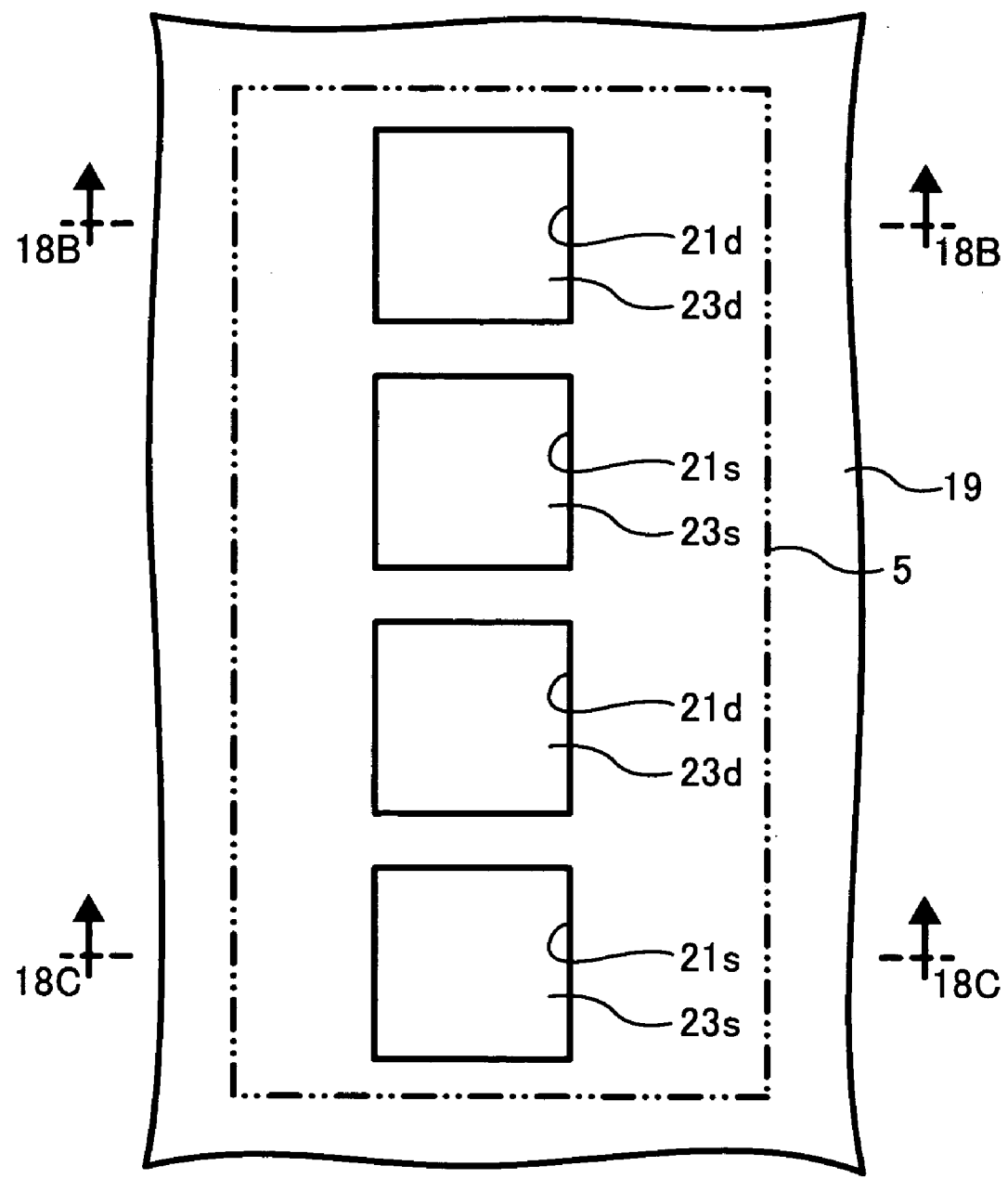
FIG. 18A is a top view of a semiconductor apparatus according to another embodiment.
Figure 18B:
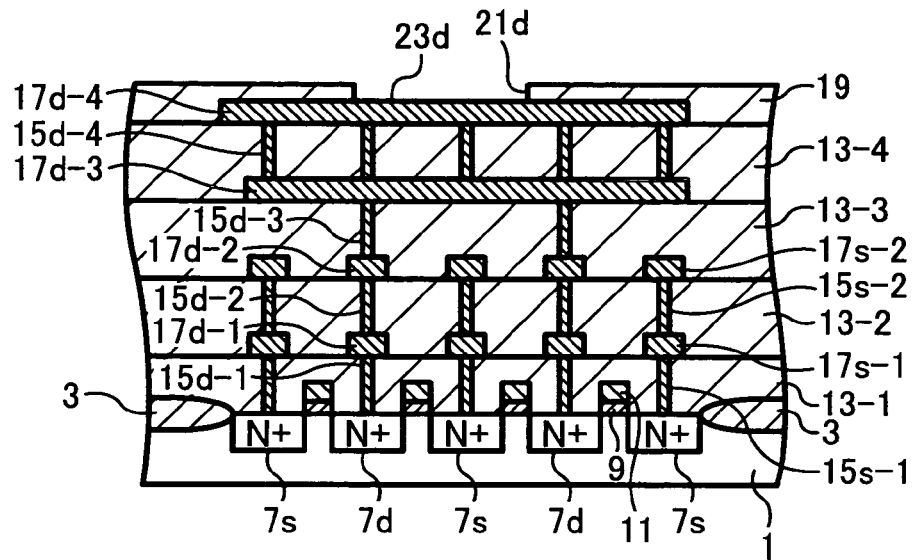
FIG. 18B is a cross-sectional side view taken in an A-A line of FIG. 18A.
Figure 18C:
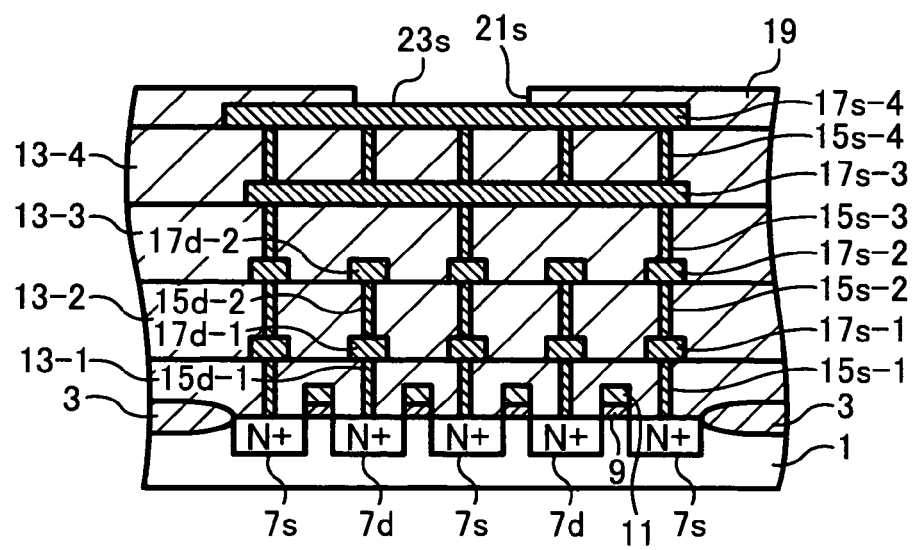
FIG. 18C is a cross-sectional side view taken in a B-B line of FIG. 18A.
Figure 19A:
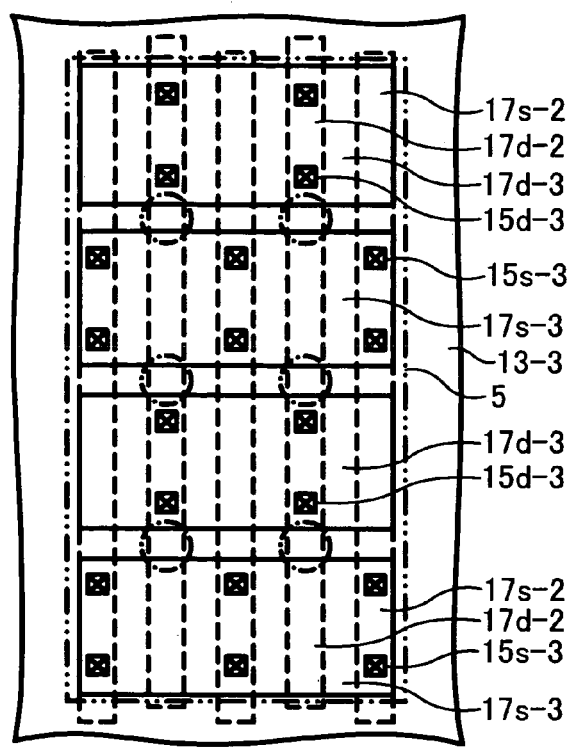
FIG. 19A is a top view of the third metal-wiring layer of the semiconductor apparatus of FIG. 18A.
Figure 19B:
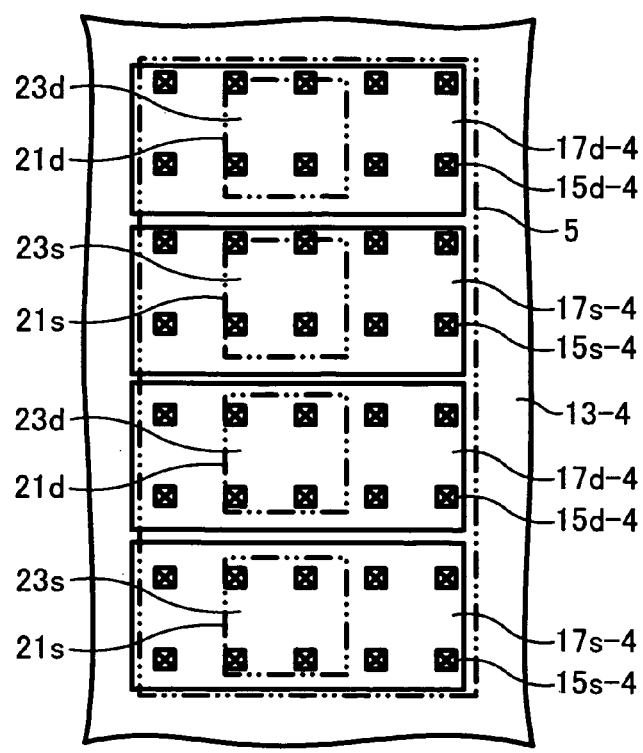
FIG. 19B is a top view of the fourth metal-wiring layer of the semiconductor apparatus of FIG. 18A.

This example is provided with two electrode pads 23$s$ and two electrode pads 23$d$ which are alternately arranged, as illustrated in FIG. 18A. The third metal-wiring layers 17$s$-3 and 17$d$-3 are also alternately arranged, as illustrated in FIG. 19A.

As explained with reference to FIG. 17A, this example may also likely cause the phenomenon of electro-current constriction in the metal-wiring layers 17$s$-2 and 17$d$-2 of this example; however, as indicated by circles with alternate long and short dashed lines in FIG. 19A, points where electro-current constriction occurs is divided into three in each of the metal-wiring layers 17$s$-2 and 17$d$-2, so that the currents flowing through these points of electro-current constriction do not exceeds the maximum allowable current amount. Thereby, this example solves the problem of electro-current constriction. Accordingly, in this example, the metal-wiring layers 17$s$-2 and 17$d$-2 do not need to be thickened to prevent the problem of electro-current constriction. As a consequence, it becomes possible to suppress an increase of an area occupied by the driver transistors.

The present disclosure is not limited to the above-explained examples, in which shapes, materials, arrangements, component numbers are simply exemplified, and numerous additional modifications and variations are possible in light of the above teachings.

For example, the first and second metal-wiring layers 17$s$-1, 17$d$-1, 17$s$-2, and 17$d$-2 may be in an island shape.

Also, the present disclosure can be applied to a two- or three-metal-wiring-layer structure, or a five- or more metal-wiring-layer structure, although the above-explained example is applied to the four-metal-wiring-layer structure.

Although the above-explained examples apply the driver transistors to a component to be arranged under the electrode pad, the present disclosure is not limited to it and can be applied to a device, having two or more electrodes and which are arranged under the electrode pad. Such a device is, for example, a transistor having a pair of source and drain, a resistance or a capacitor including a polysilicon, a thin-film metal, a diffusion layer, etc., and the like.

It is now to be understood that within the scope of the appended claims, the disclosure of this patent specification may be practiced otherwise than as specifically described herein.

This patent specification is based on Japanese patent application, No. JPAP2005-271185 filed on Sep. 16, 2005 in the Japan Patent Office, the entire contents of which are incorporated by reference herein.

What is claimed is:

1. A semiconductor apparatus forming a multi-layered metal-wiring structure, comprising:
    a device having at least two electrodes including first and second electrodes;
    at least two metal-wiring layers including an uppermost metal-wiring layer and a next-uppermost metal-wiring layer; and
    an insulation film formed on the uppermost metal-wiring layer and including at least two pad openings including first and second pad openings,
    wherein a first portion of the uppermost metal-wiring layer exposed to air through the first pad opening forms a first electrode pad and a second portion of the uppermost metal-wiring layer exposed to air through the second pad opening forms a second electrode pad,
    wherein the first electrode pad is located over the device and is electrically connected to the first electrode, and the second electrode pad is located over the device and is electrically connected to the second electrode,
    wherein a first portion of the next-uppermost metal-wiring layer is located under the first electrode pad and is electrically connected thereto, and a second portion of the next-uppermost metal-wiring layer is located under the second electrode pad and is electrically connected thereto, and
    wherein no portion of the next-uppermost metal-wiring layer electrically connected to the first electrode pad is disposed underneath the second electrode pad.

2. The semiconductor apparatus of claim 1, wherein the device includes a driver transistor, and the first and second electrodes are a source and a drain, respectively, of the driver transistor.

3. The semiconductor apparatus of claim 1, wherein the next-uppermost metal-wiring layer provided under the uppermost metal-wiring layer is arranged to lay at least under the first and second electrode pads.

4. The semiconductor apparatus of claim 1, wherein the next-uppermost metal-wiring layer is provided with no through holes for electrically connecting to the first and second electrode pads.

5. The semiconductor apparatus of claim 1, wherein each of the uppermost metal-wiring layer and the next-uppermost metal-wiring layer has an area greater than the first pad opening in a vicinity thereof and another area greater than the second pad opening in a vicinity thereof, and
    wherein the next-uppermost metal-wiring layer is electrically connected to the first and second electrode pads of the uppermost metal-wiring layer with through holes provided outside peripheries of the first and second electrode pads.

6. The semiconductor apparatus of claim 1, wherein the first electrode pad includes a plurality of electrode pads.

7. The semiconductor apparatus of claim 1, wherein the second electrode pad includes a plurality of electrode pads.

8. The semiconductor apparatus of claim 1, wherein the next-uppermost metal-wiring layer is electrically connected to the first electrode pad via through holes formed on the first electrode.

9. The semiconductor apparatus of claim 1, wherein the at least two metal-wiring layers further include lower metal-wiring layers arranged under the next-uppermost metal-wiring layer, and wherein the next-uppermost metal-wiring layer is electrically connected to the first electrode pad via through holes formed on the first electrode and the lower metal-wiring layers.

10. The semiconductor apparatus of claim 1, wherein the next-uppermost metal-wiring layer is electrically connected to the second electrode pad via through holes formed on the second electrode.

11. The semiconductor apparatus of claim 1, wherein the at least two metal-wiring layers further include lower metal-wiring layers arranged under the next-uppermost metal-wiring layer, and wherein the next-uppermost metal-wiring layer is electrically connected to the second electrode pad via through holes formed on the second electrode and the lower metal-wiring layers.

12. The semiconductor apparatus of claim 1, further comprising:

a lower metal-wiring layer disposed below the next-uppermost metal-wiring layer, at least a portion of the lower metal-wiring layer being disposed beneath the second electrode pad and electrically connected to the first electrode.

13. The semiconductor apparatus of claim 12, wherein at least a portion of the next-uppermost metal-wiring layer is disposed between the at least a portion of the lower metal-wiring layer and the second electrode pad and is electrically connected to the second electrode pad.

14. The semiconductor apparatus of claim 1, further comprising:

a lower metal-wiring layer disposed below the next-uppermost metal-wiring layer, at least a portion of the lower metal-wiring layer being disposed beneath the first electrode pad and electrically connected to the second electrode.

15. The semiconductor apparatus of claim 14, wherein at least a portion of the next-uppermost metal-wiring layer is disposed between the at least a portion of the lower metal-wiring layer and the first electrode pad and is electrically connected to the first electrode pad.

16. The semiconductor apparatus of claim 1, wherein the first portion of the next-uppermost metal wiring layer is not electrically connected to the second portion of the next-uppermost metal-wiring layer.

17. A semiconductor apparatus forming a multi-layered metal-wiring structure, comprising:

a device having at least two electrodes including first and second electrodes;

at least two metal-wiring layers including an uppermost metal-wiring layer and a next-uppermost metal-wiring layer; and an insulation film formed on the uppermost metal-wiring layer and including at least two pad openings including first and second pad openings, wherein a first portion of the uppermost metal-wiring layer exposed to air through the first pad opening forms a first electrode pad and a second portion of the uppermost metal-wiring layer exposed to air through the second pad opening forms a second electrode pad, wherein the first electrode pad is located over the device and is electrically connected to the first electrode, and the second electrode pad is located over the device and is electrically connected to the second electrode, wherein a first portion of the next-uppermost metal-wiring layer is located under the first electrode pad and is electrically connected thereto, and a second portion of the next-uppermost metal-wiring layer is located under the second electrode pad and is electrically connected thereto, and wherein no portion of the next-uppermost metal-wiring layer electrically connected to the second electrode pad is disposed underneath the first electrode pad.

* * * * *